(12) United States Patent
Onakado et al.

(10) Patent No.: US 8,431,900 B2
(45) Date of Patent: Apr. 30, 2013

(54) INFRARED SOLID-STATE IMAGING DEVICE

(75) Inventors: Takahiro Onakado, Tokyo (JP);
Masashi Ueno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 296 days.

(21) Appl. No.: 13/035,173

(22) Filed: Feb. 25, 2011

(65) Prior Publication Data
US 2011/0210251 A1 Sep. 1, 2011

(30) Foreign Application Priority Data

Feb. 26, 2010 (JP) ................. 2010-042032
Jan. 17, 2011 (JP) ................. 2011-006777

(51) Int. Cl.
*G01J 5/20* (2006.01)
(52) U.S. Cl.
USPC ........................................... 250/338.4
(58) Field of Classification Search ............... 250/338.4
See application file for complete search history.

(56) References Cited

U.S. PATENT DOCUMENTS 6,696,687 B1  2/2004  Tomisaki et al.
2009/0194698 A1  8/2009  Onakado et al.

FOREIGN PATENT DOCUMENTS

| JP | 2001-56382 A | 2/2001 |
| JP | 2003-222555 | 8/2003 |
| JP | 2003-319265 A | 11/2003 |
| JP | 2004-364241 | 12/2004 |
| JP | 2005-214639 | 8/2005 |

OTHER PUBLICATIONS

Office Action issued Sep. 25, 2012 in Japanese Patent Application No. 2011-006777 with partial English language translation.
Tomohiro Ishikawa et al., "Low-cost 320×240 uncooled IRFPA using conventional silicon IC process", SPIE Conference on Infrared Technology and Applications XXV, Apr. 1999, vol. 3698, pp. 556-564.

*Primary Examiner* — David Porta
*Assistant Examiner* — Hugh H Maupin
(74) *Attorney, Agent, or Firm* — Oblon, Spivak, McClelland, Maier & Neustadt, L.L.P.

(57) ABSTRACT

A thermal infrared solid-state imaging device includes a horizontal scanning circuit for scanning a pixel area horizontally to read an infrared image, and vertical scanning circuits provided at both ends of the pixel area. The vertical scanning circuits drive a drive line by applying a driving voltage at both ends of the drive line (in two-end driving). Further a bias voltage is applied at the end of the pixel area to a bias line connected to differential integrating circuits.

10 Claims, 11 Drawing Sheets

INFRARED SOLID-STATE IMAGING DEVICE

BACKGROUND ART

1. Field of the Invention

The present invention relates to a thermal infrared solid-state imaging device for detecting a temperature change generated by an incident infrared ray with two-dimensionally arrayed semiconductor sensors, and more particularly to a thermal infrared solid-state imaging device that integrates electric signals from the semiconductor sensors in a signal processing circuit to outputs a detection signal.

2. Related Art

A general thermal infrared solid-state imaging device includes pixels, each having a thermally insulating structure, which are arrayed two-dimensionally, and captures an infrared image by using a change in temperature of pixels caused by an incident infrared ray. Regarding a non-cooling type thermal infrared solid-state imaging device, as a temperature sensor serving as a pixel, several sensors are known, such as a bolometer which is made of polysilicon, amorphous silicon, silicon carbide, vanadium oxide, or the like, or a semiconductor device such as diode or transistor, and so on. In particular, the semiconductor device such as diode has small fluctuation in electric characteristic and temperature dependency among devices, and is very advantageous for improving the uniformity of characteristics of individual pixels.

In the thermal infrared solid-state imaging device, pixels are arrayed two-dimensionally, and each of rows is connected via a drive line, and each of columns is connected via a signal line. Each drive line is sequentially selected by a vertical scanning circuit and a switch, and power is supplied to the pixel from a power source by way of the selected drive line. The output of the pixel is transmitted to an integrating circuit by way of a signal line, and is integrated and amplified in the integrating circuit, and is sequentially output to an output terminal by means of a horizontal scanning circuit and a switch (see, for example, "Low-cost 320×240 non-cooling IRFPA using conventional silicon IC process", Ishikawa et al., Part of the SPIE Conference on Infrared Technology and Applications XXV, published April 1994, Vol. 3698, pages 556-564).

In such a thermal infrared solid-state imaging device, voltage drop in the drive line affects the voltage supplied into the integrating circuit, in addition to the voltage across the pixel, so that amount of the voltage drop in the drive line differs in each pixel column. As a result, the output of the integrating circuit is different in each pixel column, so that an offset distribution due to resistance of a drive line occurs in a captured image. Besides, the response to infrared light of the thermal infrared solid-state imaging device, that is, the change in the voltage across the pixel is far smaller than the voltage drop component in the drive line. Accordingly, the amplifier may be saturated by the voltage drop distribution by the drive line, and a necessary degree of amplification may not be achieved.

Moreover, the response of the pixel includes a response due to a device temperature change aside from the response of infrared light, and thus the device output may drift along with the device temperature change. In other words, it is ideal that the pixel is completely insulated from heat so that only the temperature change due to infrared absorption can be detected, however the heat insulation structure of the pixel has a finite heat resistance, and thus the output changes if the ambient temperature varies during detection operation. Since the output variation due to this ambient temperature change cannot be distinguished from the change in the incident infrared ray, the measurement precision of infrared ray is lowered, and a stable image cannot be obtained.

To solve the problems, the thermal infrared solid-state imaging device disclosed in JP2005-214639A has the following structure. Specifically, as shown in FIG. 13, the thermal infrared solid-state imaging device includes pixel arrays 1 disposed two-dimensionally, reference dummy pixel columns 12 composed by excluding a thermally insulating structure and/or an infrared ray absorbing structure, signal lines 23 connected to first constant current means 2 at a terminal end, bias lines 19 for connecting in parallel second constant current means 20 provided in each column of a pixel area for causing a voltage drop nearly same as drive lines 3, and differential integrating circuits 7 for integrating the difference of the voltages at both ends of the first constant current means 2 and the second constant current means 20 for a constant period of time to output the integrated signal. A sample hold circuit 13 samples and holds a reference dummy pixel output signal from the differential integrating circuits 7, compares the reference dummy pixel output signal with a reference voltage, generates a bias voltage depending on the difference, and supplies the bias voltage to the bias lines 19. By such use of the differential integrating circuits in reading of outputs and the feedback mechanism of outputs of the reference dummy pixel columns to the differential integrating circuits, it is possible to solve the conventional problems, that is, the offset distribution due to voltage drop in the drive line and the temperature drift due to device temperature fluctuations.

In the two-dimensional pixel array of the above thermal infrared solid-state imaging device, if the number of pixels is increased to large number (for example, the number of pixels over 640×480 pixels for the two-dimensional pixel array in the conventional mainstream of the thermal infrared solid-state imaging device), the following problems occur.

To realize large number of pixels while maintaining the frame rate fr, it is necessary to set the operation speed of the horizontal scanning circuit at least higher than $(1/fr)/(m*n)$, where, m is the number of horizontal pixels and n is the number of vertical pixels of the two-dimensional pixel array which has large number of pixels. The frame rate fr is a speed of sweeping out the outputs of all pixels by the thermal infrared solid-state imaging device (that is, the performance index showing how many two-dimensional images can be displayed per second) (for example, 30 fps).

If the operation speed of the horizontal scanning circuit being set higher than $(1/fr)/(m*n)$ exceeds the operation speed of the MOS transistors on the semiconductors composing the thermal infrared solid-state imaging device, it is necessary to reduce the operation speed of the horizontal scanning circuit.

In the conventional thermal infrared solid-state imaging device, moreover, it may be considered to reduce the offset distribution by the use of differential integrating circuit in reading of outputs, and the feedback mechanism of outputs of the reference dummy pixel columns to the differential integrating circuit. However, even though these techniques are used, the increase of the number of pixels expands the voltage drop itself in the drive line, so that it is difficult to assure the input voltage range of the differential integrating circuit more than the voltage of the increased voltage drop in the drive line.

SUMMARY OF THE INVENTION

It is hence an object of the present invention to provide a thermal infrared solid-state imaging device capable of solving the problem of voltage drop in the drive line occurring in mega-pixel structure of the thermal infrared solid-state imaging device (in which, the number of pixels is increased), and suppressing the temperature drift caused by device temperature variations.

A thermal infrared solid-state imaging device according to the invention, includes a pixel area having photosensitive pixels disposed two-dimensionally. The photosensitive pixel has first and second terminals and includes one or more diodes connected in series. The diode includes a thermally insulating structure and/or an infrared ray absorbing structure. The thermal infrared solid-state imaging device includes:

drive lines each connecting commonly the first terminals of the photosensitive pixels in each row of the pixel area;

first and second vertical scanning circuits for selecting the drive line sequentially, and supplying a supply voltage to the selected drive line at both ends of the pixel area, respectively;

signal lines connecting commonly second terminals of the photosensitive pixels in each column of the pixel area, the signal line being connected to first constant current means at end of the signal line;

a bias line connecting in parallel second constant current means provided in each column of the pixel area, and generating a voltage drop substantially same as that of the drive line;

a differential integrating circuit that is provided in each column of the pixel area, for integrating a difference between a voltage across the first constant current means and a voltage across the second constant current means for a predetermined period of time, and outputting the integration result;

a horizontal scanning circuit for selecting in each column an output signal of the differential integrating circuit with respect to the pixel of the pixel area and leading the output signal to an output terminal;

a reference signal output circuit for outputting a reference signal which changes substantially depending on the temperature change of the entire thermal infrared solid-state imaging device, the reference signal output circuit including one or plural of reference dummy pixel columns, the reference dummy pixel column including reference dummy pixels each of which does not include a thermally insulating structure and/or an infrared ray absorbing structure; and a bias generating circuit for generating a bias voltage depending on a difference between a differential signal between a voltage at a specified position on the bias line and the reference signal, and a reference voltage.

The bias voltage is applied to positions on the bias line corresponding to both ends of the pixel area.

In the present invention, the "specified position on the bias line" is any fixed position on the bias line, and is not particularly specified in location. In other words, in the present invention, a voltage at a specified position on the bias line is taken out in order to monitor the voltage level of the entire bias line. Accordingly the voltage can be monitored at any position, that is, the position of monitoring the voltage does not affect the concept of the invention.

Also in the present invention, the "reference voltage" is any constant voltage, and is not limited to any specified voltage. In other words, in the present invention, the "reference voltage" is a reference which is used for correcting automatically a basis voltage to be fed back. Therefore, the "reference voltage" may be any voltage, that is, not affecting the concept of the invention, as far as it is constant and is selected so that the output signal of the differential integrating circuit can be within the dynamic range of a circuit in the subsequent stage of the differential integrating circuit.

According to the invention, even thought the number of pixels of the two-dimensional pixel array of the thermal infrared solid-state imaging device is increased to be large number (in mega-pixel structure), it is possible to reduce voltage drop in the drive line and to suppress temperature drift due to device temperature variations.

DETAILED DESCRIPTION OF PREFERRED EMBODIMENTS

Referring now to the accompanying drawings, preferred embodiments of the present invention are specifically described below.

First Embodiment

Figure 1:
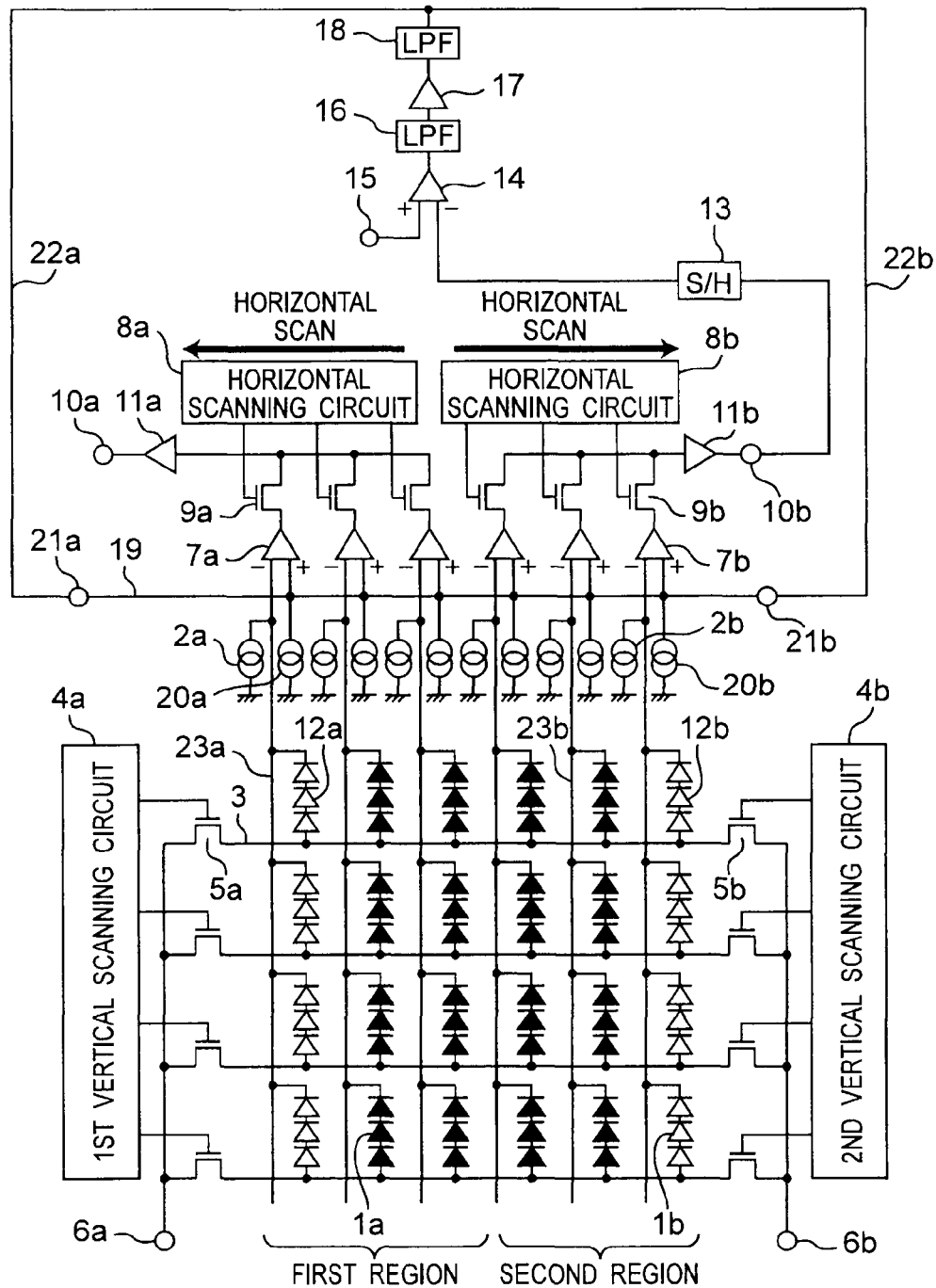
FIG. 1 is a circuit block diagram showing a thermal infrared solid-state imaging device in a first embodiment of the present invention.

FIG. 1 is a circuit diagram sowing a thermal infrared solid-state imaging device in a first embodiment of the present invention. In the thermal infrared solid-state imaging device, similarly to the conventional thermal infrared solid-state imaging device, a plurality of diodes each having an infrared ray absorbing structure and a thermally insulating structure are connected in series to form individual photosensitive pixels $1a$ and $1b$. The photosensitive pixels $1a$ and $1b$ are disposed two-dimensionally to form a pixel area.

The pixel area is divided into right and left parts from the middle. The left part of the pixel area is a first region, and the right part of the pixel area is a second region. The number of pixels contained in the first region is preferred to be same as the number of pixels contained in the second region. The photosensitive pixel 1a is a photosensitive pixel formed in the first region of the pixel area, and the photosensitive pixel 1b is a photosensitive pixel farmed in the second region of the pixel area.

In each row of the photosensitive pixels 1a and 1b, drive lines 3 for commonly connecting the photosensitive pixels 1a and 1b are provided. In each of columns of the photosensitive pixels 1a and 1b, signal lines 23a or 23b for commonly connecting the photosensitive pixels 1a or photosensitive pixels 1b are provided. At terminal ends of the signal lines 23a and 23b, constant current sources 2a and 2b are connected as the first constant current means group.

At the left part of the pixel area, the first vertical scanning circuit 4a and the first switches 5a are formed. At the right part of the pixel area, the second vertical scanning circuit 4b and the second switches 5b are formed. By the first vertical scanning circuit 4a and the first switch 5a, the drive line 3 is selected sequentially to be connected to a power source 6a. At the same time, by the second vertical scanning circuit 4b and the second switch 5b, the drive lines 3 is selected sequentially, to be connected to a power source 6b. The power source 6a and the power source 6b are power sources providing the same voltage. By this configuration, the selected drive line 3 is supplied with a voltage from both ends of the drive lines 3 from the power sources 6a ad 6b providing the same voltage (two-end driving).

On the other hand, in each of columns of the pixels 1a and 1b closely to the constant current sources 2a and 2b, constant current sources 20a and 20b supplying a current nearly same as the constant current sources 2a and 2b are disposed as the second constant current means group. The constant current sources 20a and 20b are connected in parallel by means of a bias line 19 nearly parallel to the drive lines 3. The bias line 19 has a resistance value nearly same as that of the drive line 3 so as to cause a voltage drop nearly same as that of the drive line 3. The bias line 19 is required only to cause a voltage drop nearly same as that of the drive line 3, and does not always have the same resistance value same as that of the drive line 3. If the current value of the constant current sources 2a and 2b is different from that of the constant current sources 20a and 20b, the bias line 19 and the drive line 3 may have different resistance values according to the difference.

In each of columns of the pixels 1a and 1b, differential amplification integrating circuits 7a and 7b are provided. The differential amplification integrating circuits 7a and 7b integrate, amplify, and produce the difference between the voltage across the constant current sources 2a and 2b and the voltage across the constant current sources 20a and 20b. For the photosensitive pixel 1a of the first region, a horizontal scanning circuit 8a and a horizontal selecting circuit 9a are formed, and for the photosensitive pixel 1b of the second region, a horizontal scanning circuit 8b and a horizontal selecting circuit 9b are formed.

The horizontal scanning circuits 8a and 8b simultaneously scan from the boundary of the first region and the second region of the pixel area, respectively, toward the end portions of the pixel area. The horizontal scanning circuits 8a and 8b turns on the horizontal selecting circuits 9a and 9b sequentially, so that output signals of the differential amplification integrating circuits 7a and 7b disposed in each column are sent out to the outside from output terminals 10a and 10b by way of output amplifiers 11a and 11b. In this manner, according to the embodiment, the horizontal scanning circuit includes two horizontal scanning circuits 8a and 8b disposed in the first region and the second region of the pixel area respectively.

Herein, in the bias line 19, a voltage drop nearly same as in the drive line 3 is produced. Accordingly, this configuration cancels the voltage drop in the drive line 3 from the output signal to remove the offset distribution attributable to the drive line 3. In other words, the difference between the reference signal and the voltage of the bias line 19 is obtained, and the differential signal is compared with the reference voltage. The bias voltage depending on the difference is generated, and is fed back to the bias line 19. As a result, the voltage of the bias line 19 is varied depending on the reference signal (depending on the device temperature), so that voltage variation of the bias line 19 due to manufacturing fluctuations can be corrected automatically.

In the preferred embodiment, pixels 12b in one column at the right side of the pixel area are reference pixels not having a thermally insulating structure and/or an infrared ray absorbing structure. The voltage across the constant current source 2b connected to this reference pixel 12b is read out as a reference signal. This reference signal is read out in the same way as a signal from an ordinary pixel 1b. In other words, the voltage across the current source 2b connected to the reference pixel 12b and the voltage across the current source 20b connected to the bias line 19 adjacent to the current source 2b are supplied to the minus terminal and the plus terminal of the differential integrating circuit 7b respectively, and integrated and amplified. Then, by the horizontal scanning circuit 8b and the switch 9b, an output signal corresponding to the reference pixel 12b is read out in each line in normal image reading, and is output from an output terminal 10b by way of an amplifier 11b.

In the meantime, pixels in one column at the left side of the pixel area are also reference pixels 12a. This is preferably intended to unify the number of pixels between the first region and the second region, and they are not used for the feedback of reference signals in the present embodiment. Of course, not only the reference pixels 12b but also the reference pixels 12a may be used for the feedback of reference signals.

The output terminal 10b is connected to a sample hold circuit 13, and a sample hold timing signal is supplied so as to perform sample hold operation at the timing of output of the output signal of the reference pixel column to the output terminal 10b. The output of the sample hold circuit 13 is fed to a minus terminal of a bias generating circuit (basically a subtracting circuit) 14. A reference voltage is supplied to a plus terminal of the bias generating circuit 14. The bias generating circuit 14 generates a bias voltage depending on the difference between the input voltages supplied into the both input terminals. The generated bias voltage is supplied into a low pass filter 16, a buffer amplifier 17, and a low pass filter 18, and then is branched, and finally supplied to terminals 21a and 21b at both ends of the image area of the bias line 19 by way of wirings 22a and 22b. Herein, the wiring 22a and the wiring 22b are adjusted to be equal in the wiring resistance as far as possible.

Polarity for subtraction of the differential integrating circuits 7a and 7b and polarity for subtraction of the bias generating circuit 14 are selected in a direction of suppressing the changes of the output signals corresponding to the reference pixels 12b. Specifically, when the voltage of the bias line 19 (the voltage of the current sources 20a and 20b connected to the bias line 19) is supplied to the plus terminal of the differential integrating circuits 7a and 7b, the outputs of the differential integrating circuits 7a and 7b are supplied to the minus terminal of the bias generating circuit 14. To the contrary, when the voltage of the bias line 19 is supplied to the minus terminal of the differential integrating circuits 7a and 7b, the outputs of the differential integrating circuits 7a and 7b are supplied to the plus terminal of the bias generating circuit 14. As a result, depending on the difference between the sample-hold signal and the reference signal, the bias generating circuit 14 changes the voltage of the bias line 19 in a direction of decreasing this difference.

With this configuration, in the embodiment, same as in JP 2005-214639 A, voltage fluctuation of the bias line due to manufacturing fluctuations can be corrected automatically. Therefore the device output corresponding to the reference pixel 12b (equivalent to the reference voltage level of the image signal) is nearly constant, not affected by manufacturing fluctuation of the direct-current offset components in the circuit, so that it is possible to prevent the downstream circuits inside and outside the device from inputting a signal over dynamic range which is caused by manufacturing fluctuation of each device. Moreover, the voltage of the bias line 19 not only simulates the voltage drop of the drive line 3 caused by the current sources 2a and 2b provided in each column, but also changes while reflecting the device temperature drift information due to the reference pixel 12b. It is hence possible to suppress offset distribution and temperature drift which would be caused by voltage drop in the drive line 3.

In other words, to the minus terminals of the differential integrating circuits 7a and 7b corresponding to the normal pixels 1a and 1b, the following signals are supplied:

a) signal component of voltage drop of the drive line 3;

b) signal component of change in pixel signals of pixels 1a and 1b due to ambient temperature; and c) signal component of change in outputs of pixels 1a and 1b due to incident infrared ray.

On the other hand, to the plus terminals of the differential integrating circuits 7a and 7b corresponding to the normal pixels 1a and 1b, the following signals are supplied:

a') signal component of voltage drop at the bias line 19; and b') signal component of change in reference signal due to ambient temperature.

The signal component of voltage drop (a) of the drive line 3 is canceled by the signal component of voltage drop component (a') at the bias line, and the signal component of change in pixel signal (b) of the pixels 1a and 1b due to ambient temperature is canceled by the signal component of change in reference signal (b') due to ambient temperature. As a result, the differential integrating circuits 7a and 7b perform subtraction operation excepting the output changes (c) of pixels 1a and 1b due to incident infrared ray.

As stated above, in the thermal infrared solid-state imaging device of the embodiment, the pixel area is divided into the first region and the second region, and two horizontal scanning circuits 8a and 8b and two horizontal scanning switches 9a and 9b are provided, which are responsible for reading out from the first and second region, respectively. The two horizontal scanning circuits 8a and 8b simultaneously scan horizontally, and read out the signals from the divided area in parallel. As a result, as compared with the conventional imaging device not designed to read out the signals from the divided area in parallel, the operating speed of the horizontal scanning circuit can be reduced to ½.

Generally, in the thermal infrared solid-state imaging device of two-dimensional pixel array, the photosensitive pixel area becomes an imaging region. Thus when a reference signal not having sensitivity to the infrared ray is formed in the photosensitive pixel area, imaging is not possible in this area alone. Accordingly, there is a limitation that the reference pixel is formed only at an end portion of the pixel area.

Figure 9:
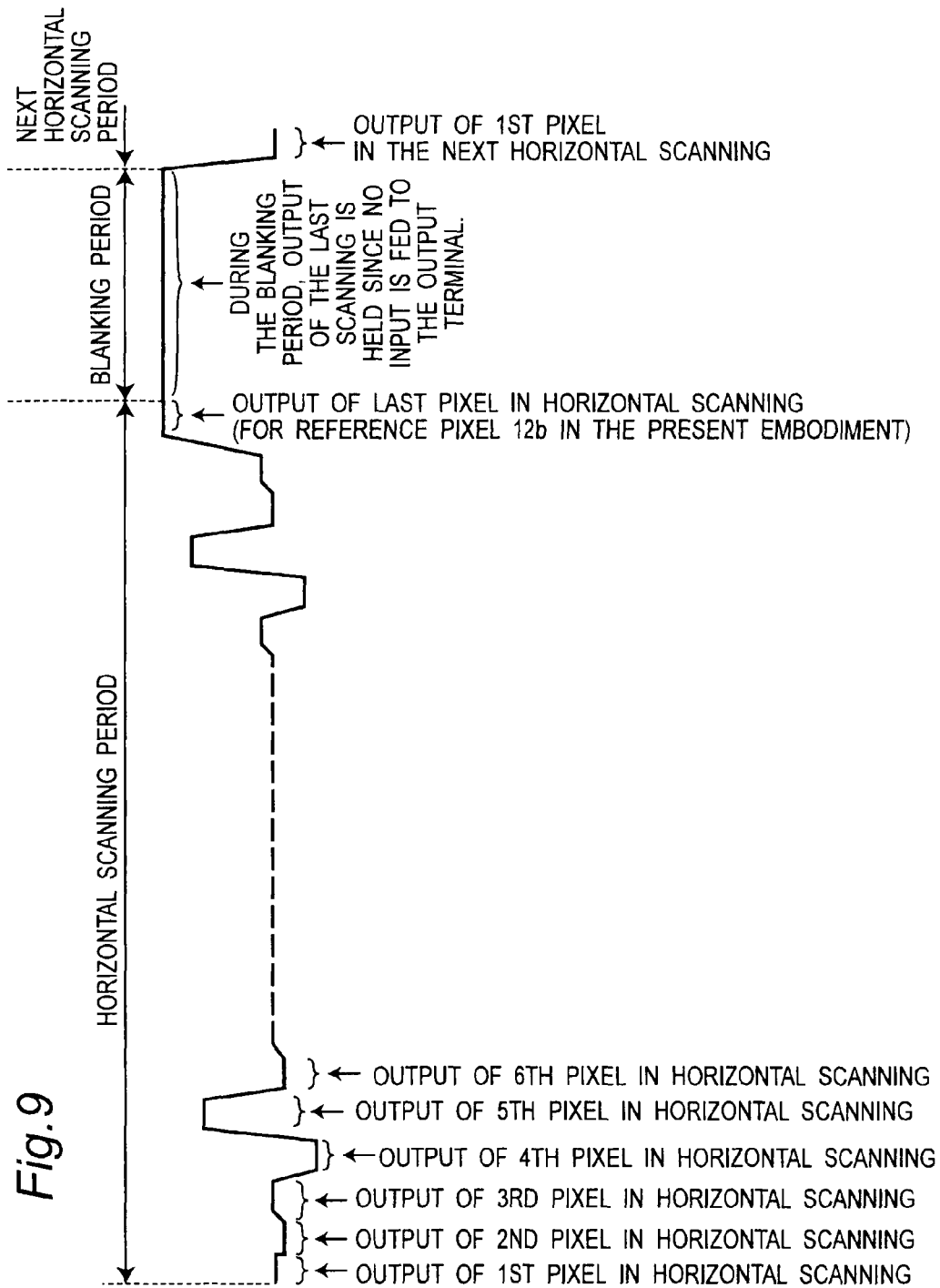
FIG. 9 is an explanatory diagram about transition of a waveform of an output voltage in horizontal scanning period and blanking period.

In the embodiment, scanning by the horizontal scanning circuits 8a and 8b is executed from the center to the end of the pixel area. As a result, the output of the reference pixel that is formed only in the end portion of the pixel area can be obtained from the final period of horizontal scanning, so that during the blanking (fly-back) period, the output from the reference pixel is maintained at the output terminal (see FIG. 9). Therefore, during the blanking period, the output from the reference pixel can be extracted by the sample hold circuit 13. Hence, when extracting the output not in the final period of horizontal scanning, it is possible to avoid the problem of failure in output extraction at high precision which would be caused by occurrence of output fluctuations by the subsequent pixels in a short period of horizontal scanning period at the output terminal. Feedback of the output of the reference pixel extracted at high precision allows temperature drift due to pixel temperature fluctuations to be suppressed effectively.

The drive line 3 is driven at both ends in the pixel area by the two vertical scanning circuits 4a and 4b disposed at both ends of the pixel area, and the bias line 19 is also driven at both ends of the pixel area (two-end driving). Hence, increase of the voltage drop of the drive line 3 caused by increase of number of pixels (mega-pixel structure) can be extremely reduced, and it can be settled within the input voltage range of the differential integrating circuits 7a and 7b. As a result, the differential integrating circuits 7a and 7b which becomes usable can cancel the voltage drop of the drive line 3 with the voltage drop of the bias line 19 to reduce extremely the offset voltage at the output voltage.

Figure 10:
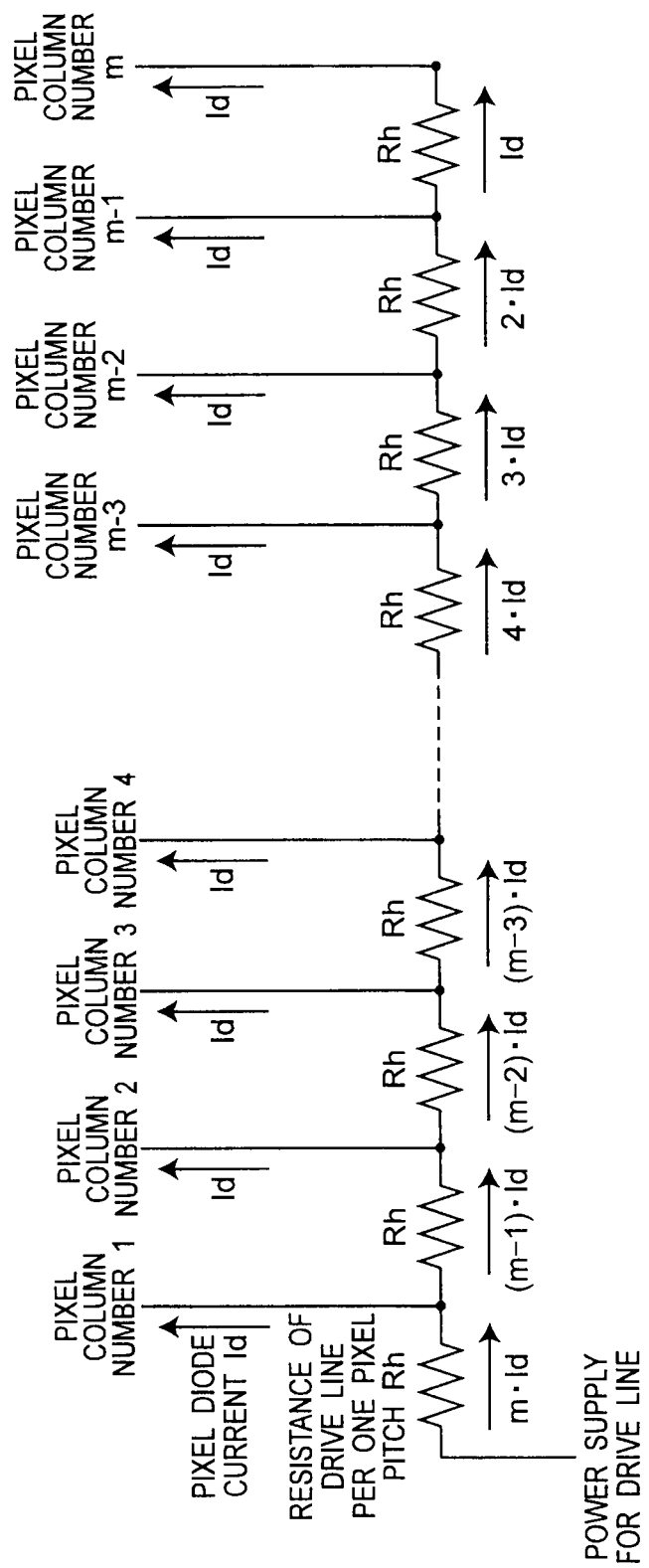
FIG. 10 is an operation explanatory diagram of one-end driving of drive lines in a prior art.
Figure 11:
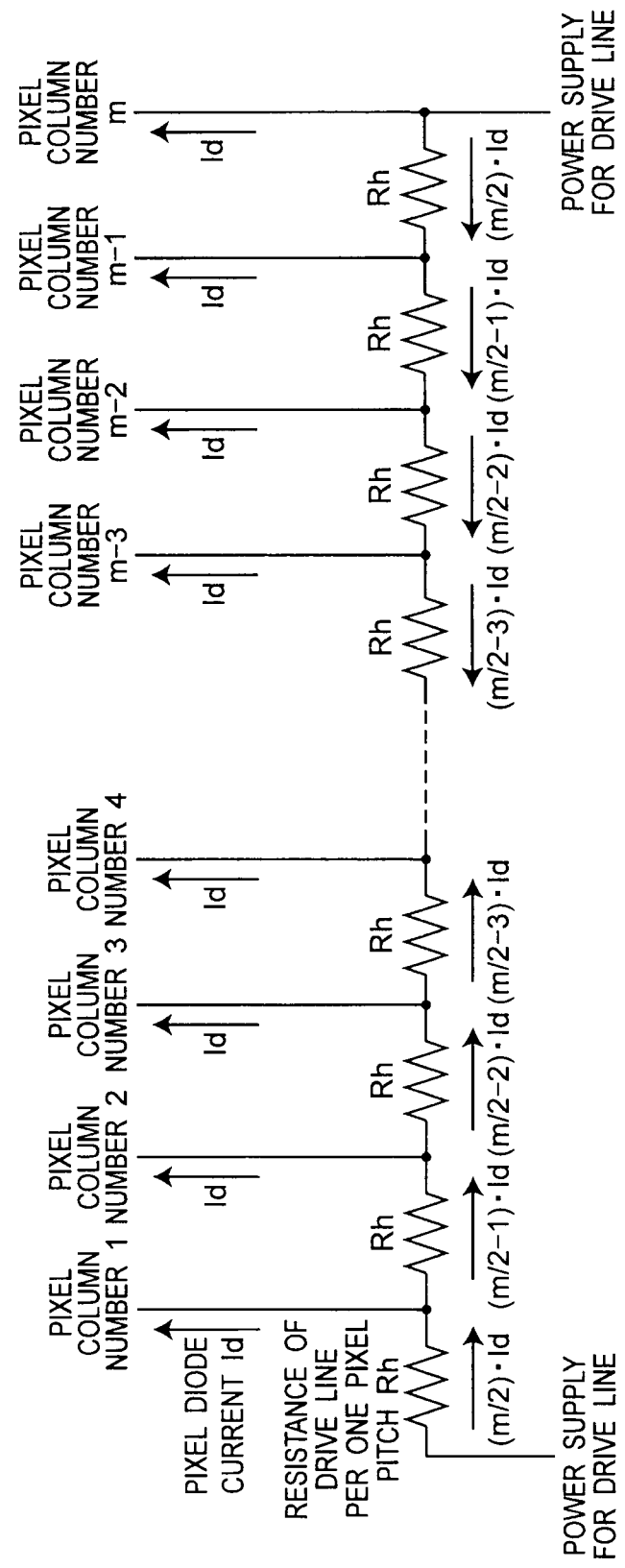
FIG. 11 is an operation explanatory diagram of two-end driving of drive lines in the embodiment of the present invention.

FIG. 10 is a diagram of explaining an operation of one-end driving of the drive lines of the conventional thermal infrared solid-state imaging device. On the drive line corresponding to the row selected by the vertical scanning circuit, as mentioned above, diode currents Id flow in parallel simultaneously in each of columns, and the diode currents Id are integrated. Accordingly, in the case of one-end driving by the vertical scanning circuit disposed at the left end of the pixel area, the current flows into the drive line as shown in FIG. 10, and the voltage drop value increases as advancing to the right end of the pixel area. On the other hand, in two-end driving of the drive line 3 according to the embodiment, the driving voltage is supplied from both ends of the pixel area (see FIG. 11).

Figure 12:
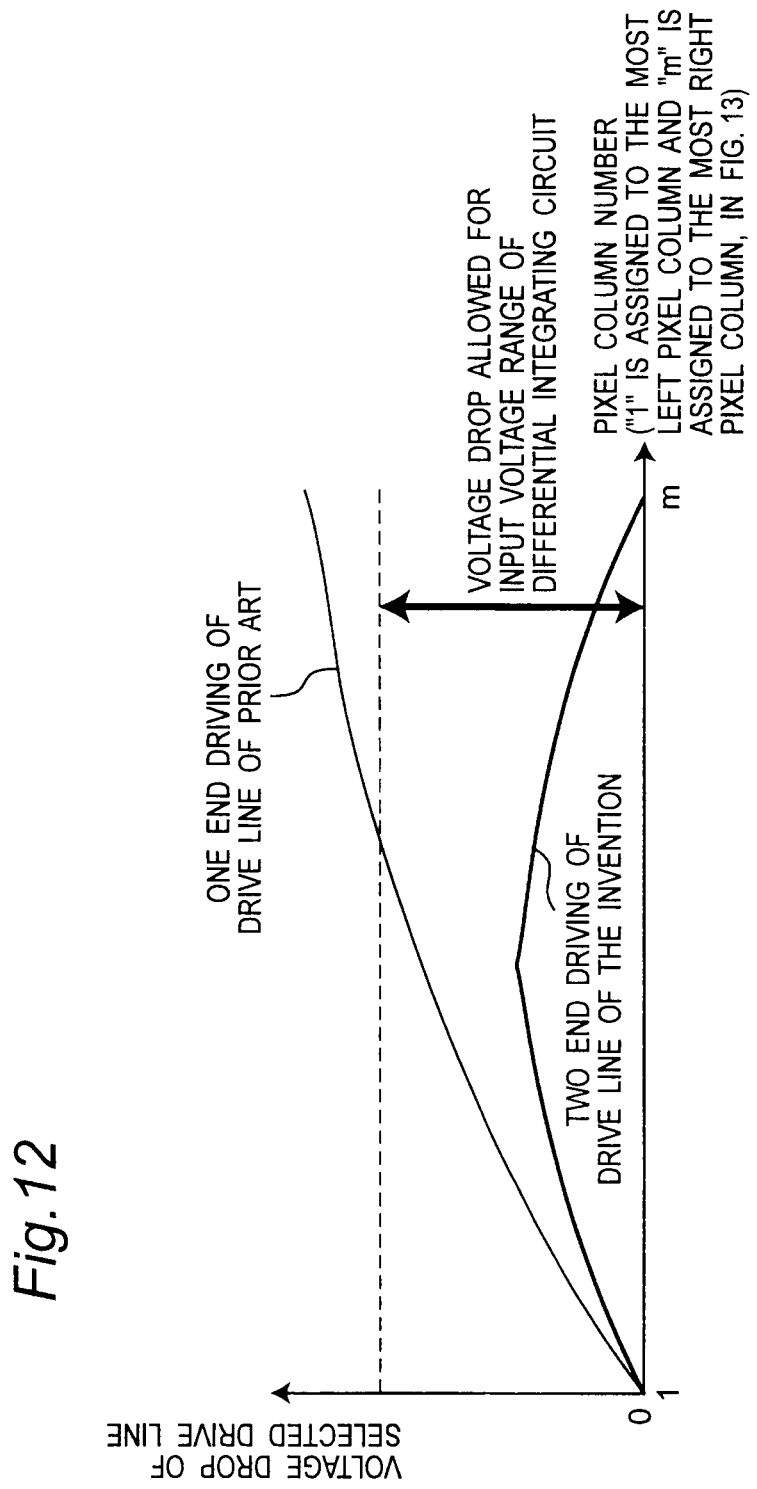
FIG. 12 is a graph showing dependency of voltage drop in a drive line, on horizontal position of pixel (pixel column number) in one-end driving of drive lines in the prior art and in two-end driving of drive lines in the embodiment of the present invention.
Figure 13:
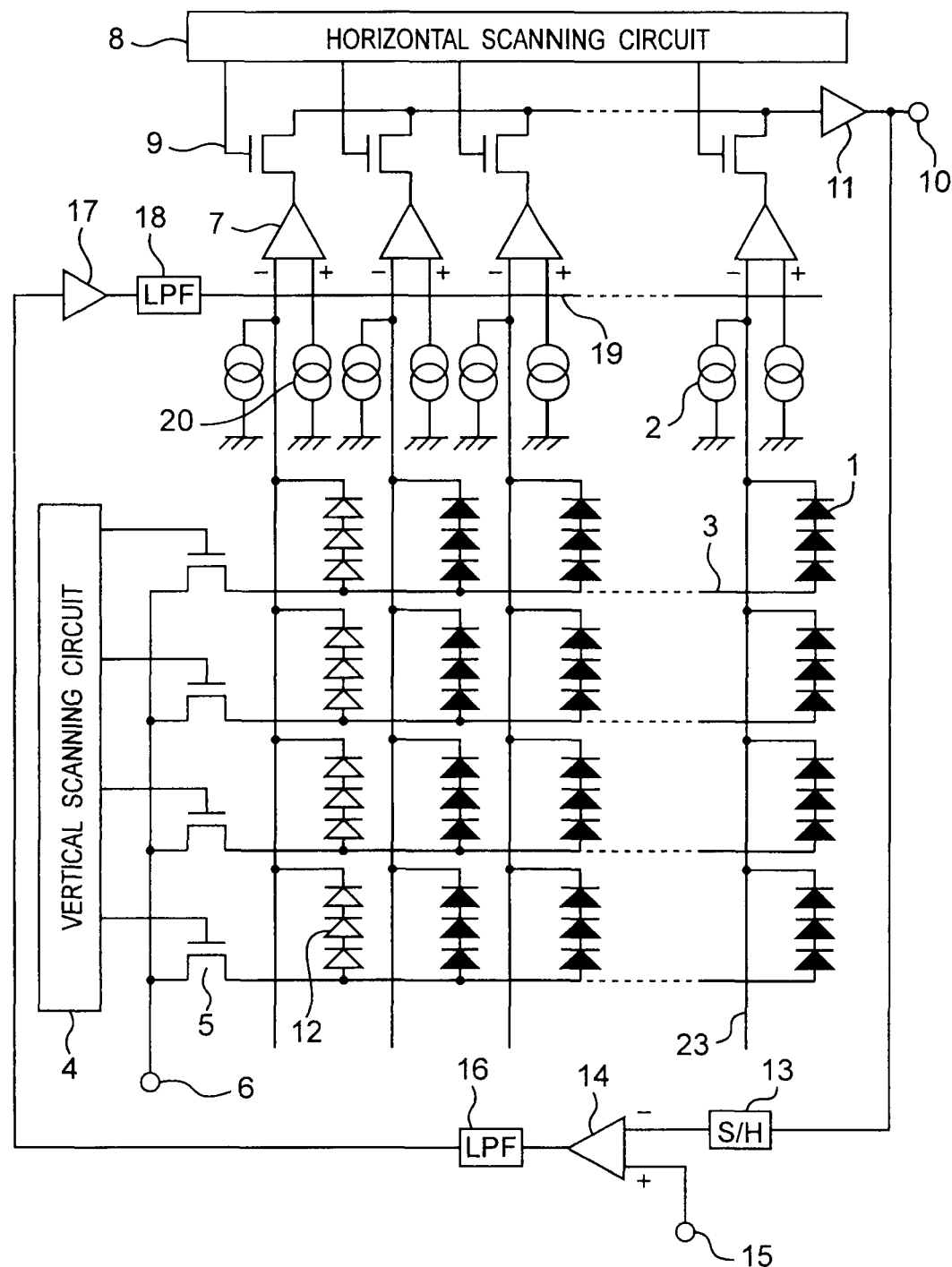
FIG. 13 is a circuit block diagram sowing a thermal infrared solid-state imaging device in the prior art.

FIG. 12 shows the dependency of drive line voltage drop on horizontal direction pixel position (pixel column number) in one-end driving of drive line in the prior art and in two-end driving of drive line in the embodiment. In the one-end driving of the conventional drive line, at the right end of the pixel area (pixel column number m, m being the number of horizontal pixels), the voltage drop of drive line is the maximum, exceeding the allowable range of the input voltage range of the differential integrating circuit used for reading operation. By contrast, in the two-end driving of drive line in the embodiment, the voltage drop of drive line is extremely reduced, and is settled within the allowable range of the input voltage range of the differential integrating circuits 7a and 7b.

Therefore, according to the configuration of the embodiment, even in the case of mega-pixel structure of the two-dimensional pixel array of the thermal infrared solid-state imaging device, problems of reduction of operating speed of the horizontal scanning circuit, and voltage drop in the drive lines can be solved at the same time, and a thermal infrared solid-state imaging device capable of suppressing the temperature drift due to pixel temperature fluctuations can be presented.

The configuration of each component of the thermal infrared solid-state imaging device of the embodiment is specifically described below.

(1) Differential Integrating Circuit

Figure 2:
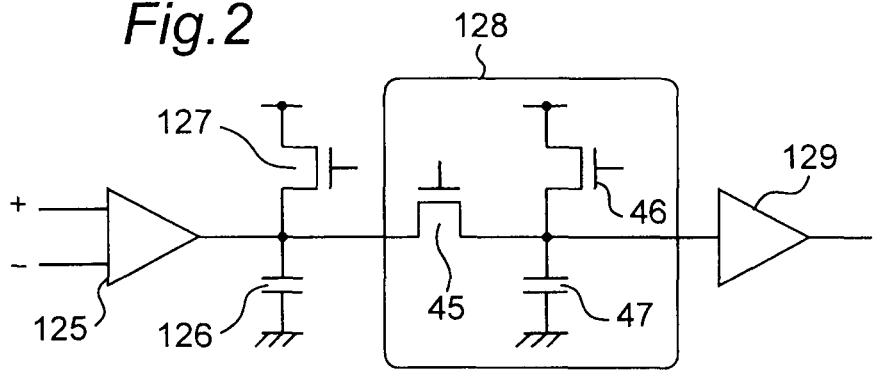
FIG. 2 is a circuit diagram showing an example of a differential integrating circuit used in the embodiment of the present invention.

FIG. 2 shows an example of configuration of the differential integrating circuits 7a and 7b. FIG. 2 shows the configuration disclosed in the previous application (JP2000-386974A) which was filed before by the inventors of the present application. As compared with a generally-known configuration using an operational amplifier, the disclosed structure becomes simplified. The differential integrating circuit shown in FIG. 2 includes a differential voltage-current conversion amplifier 125 having input terminals connected to the voltage across the constant current sources 2a and 2b and the voltage across the constant current sources 20a and 20b, respectively, an integrating capacity 126 connected to the output of the differential voltage-current conversion amplifier 125, and a reset transistor 127 connected to reset the integrating capacity 126 periodically to a reference voltage Vref. The differential voltage-current conversion amplifier 125 is connected without negative feedback. The product (=time constant) of output impedance of the differential voltage-current conversion amplifier 125 and capacitance Ci of the integrating capacity 125 may be equal to or more than 5 times of reset time Ti.

The input end of the integrating capacity 126 is connected to a sample hold circuit 128 composed of sample hold transistor 45, a sample hold capacity 47, and a reset transistor 46. The output as result of integration is sampled in the sample hold circuit 128, and is output by way of a buffer 129. In the differential integrating circuits 7a and 7b as shown in FIG. 2, the integrating circuit is composed by using the differential voltage-current conversion amplifier 125 without negative feedback, so that the circuit configuration is simplified.

(2) Low Pass Filter

The low pass filters 16 and 18 cut off the output corresponding to the reference pixel 12b, and the noise generated in the sample hold circuit 13, the bias generating circuit 14, and so on, to extract only the temperature drift components. Generally, in the infrared ray detector aiming at high S/N ratio, the noise of the power source system is sufficiently decreased in the power source circuit, and the noise from the detection unit is a main noise component for the device. The output from the bias generating circuit 14 includes the noise component generated in the reference pixel 12b, but the noise component of the reference pixel 12b and the noise component of the pixels 1a and 1b are not correlated at all with each other. Accordingly, the noise at the outputs from the differential integrating circuits 7a and 7b is $\sqrt{2}$ times as compared with the case of integrating only the outputs of the pixels 1a and 1b. On the other hand, changes of detector output due to ambient temperature changes, or changes of supply voltage due to power source circuit characteristic variations caused by ambient temperature changes are generally moderate more than the order of second. Therefore, the band of the line of passing of bias voltage may be sufficiently narrow as compared with the band necessary for the signal line for detecting an infrared ray. Accordingly, by inserting low pass filters 16 and 18 on the line for feeding back from the output terminals 10a and 10b to the input terminals of the differential integrating circuits 7a and 7b to pass only the temperature drift components, noise increase due to differential action can be suppressed. Typical value of noise band width for pixels of such infrared solid-state imaging device is about several units of kHz, and thus it is enough to set the cut-off frequency to $\frac{1}{100}$ or less thereof. From the viewpoint of device temperature fluctuation, the fluctuation period is on the order of second at most, and a band of several Hz will be sufficient. Although in the embodiment two low pass filters 16 and 18 are inserted before and after the buffer 17, it may be sufficient to insert either one of the filters 16 and 18.

Figure 3A:
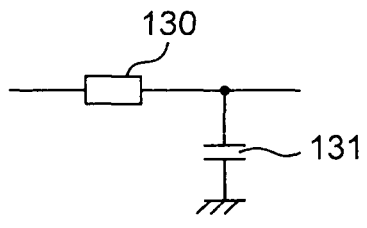
FIGS. 3A and 3B are circuit diagrams showing examples of a low-pass filter used in the embodiment of the present invention.
Figure 3B:
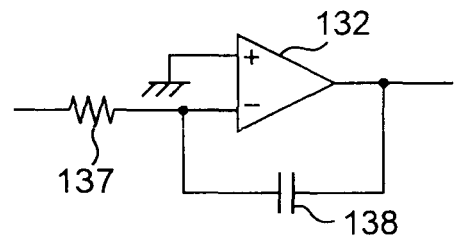

Circuit configuration examples of the low pass filters 16 and 18 are shown in FIGS. 3A and 3B. The configuration explained below may be applied to both low pass filters 16 and 18.

The low pass filter in FIG. 3A uses a passive device, including a device (resistor or reactor) 130 and a capacitor 131. For the low pass filter 18 to be inserted at the subsequent stage of the buffer amplifier 17, the device 130 is preferably a reactor which provides no direct-current voltage drop. On the other hand, for the low pass filter 16 to be inserted at the front stage of the buffer amplifier 17, the device 130 is preferably a resistor which filter characteristic can be obtained easily. The device 130 may be either an internal resistance of the power source circuit 6 or an internal resistance of the buffer amplifier 17. The low pass filter in FIG. 3B is an integrating circuit using an operational amplifier 132 as an active device, and this circuit configuration is also general as a low pass filter, and detailed description thereof is omitted.

The low pass filters 16 and 18 in this embodiment are not limited to the examples shown in FIGS. 3A and 3B only, but other filters may be similarly used (for example, a switched capacitor circuit). The low pass filters 16 and 18 may be provided either at the front stage or at the rear stage of the buffer amplifier 17, and in such a case the filter 16 is preferably provided at the front stage of the buffer amplifier 17. This is because a large current flows at the rear side of the buffer amplifier 17, and thus the voltage drop at the filter may cause fluctuation of the bias voltage.

(3) Pixel, Reference Pixel

Figure 6A:
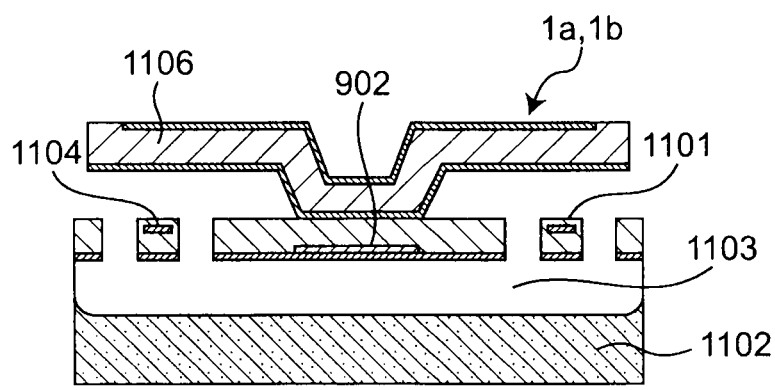
FIGS. 6A and 6B are sectional view and perspective view of an example of pixel structure of the thermal infrared solid-state imaging device of the present invention, respectively.
Figure 6B:
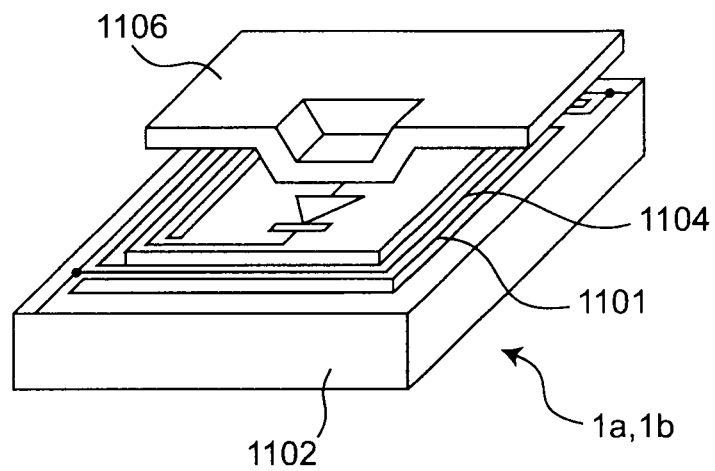

FIGS. 6A and 6B are a sectional view and a perspective view showing schematically structural examples of pixels 1a and 1b in the thermal infrared solid-state imaging device of the embodiment. In the pixels 1a and 1b, a PN junction diode 902 serving as a temperature sensor is supported on a hollow part 1103 provided in a silicon substrate 1102 by two long support legs 1101, and a wiring electrode 1104 of the diode 902 is buried in the support legs 1101. Preferably, plural PN junction diodes 902 are connected in series in order to enhance the sensitivity. The hollow part 1103 heightens the thermal resistance between the diode 902 and the silicon substrate 1102, and forms a thermally insulating structure. In this example, the diode 902 is formed on the SOI layer of the SOI substrate, and the buried oxide film beneath the SOI layer is a part of a structural body for supporting the hollow structure. An infrared absorbing structure 1106 thermally contacting the diode part is protruding above the support legs 1101 to efficiently absorb the infrared ray incoming from above in the drawing. In FIG. 6B, for the ease of understanding of the structure of the lower part, the infrared ray absorbing structure is partly omitted in the front portion of the drawing.

An infrared ray entering the pixels 1a and 1b is absorbed in the infrared ray absorbing structure 1106, and the temperature of the pixels 1a and 1b is changed with the thermally insulating structure as mentioned above, and the forward voltage characteristic of the diode 902 serving as a temperature sensor is changed. Reading this amount of change in the forward voltage characteristic of the diode 902 by a specified detecting circuit, allows an output signal corresponding to amount of the incident infrared ray to be taken out. The thermal infrared solid-state imaging device has a structure in which multiple pixels 1a and 1b are disposed two-dimensionally and are accessed sequentially. For such a device, the uniformity of characteristics among the pixels is important. The forward voltage of the diode and its temperature dependency are extremely small in variations among solid devices, and the use of the diode as the temperature sensor is particularly effective for the thermal infrared solid-state imaging device for the purpose of enhancing the uniformity of characteristics. In the embodiment, the infrared ray absorbing structure is not limited to the configuration explained above, as far as it is a structure allowing the incident infrared ray in the device to be absorbed and a temperature rise of the temperature sensor to be generated. In the embodiment, the thermally insulating structure is not limited to the hollow structure as explained above, as far as it is a structure allowing the temperature changes of the temperature sensor by infrared ray absorption to be avoided.

(4) Reference Pixel and Reference Signal Output Circuit

Regarding a circuit configuration for producing a reference signal, in this embodiment, a reference pixel is made by excluding the thermally insulating structure and/or infrared ray absorbing structure from the pixels in one column at the right end in the pixel area. The reference pixel has a same structure as normal pixels 1a and 1b substantially, except that either one or both of the thermally insulating structure and the infrared ray absorbing structure are excluded. Therefore, the reference pixel is capable of detecting the device temperature change only. If the sensitivity to infrared ray absorption can be lowered to a necessary level, either one of the thermally insulating structure and the infrared ray absorbing structure may be provided in the reference pixel. The reference pixel 12b is driven at a constant current by the power source 6b and the constant current source 2b, and outputs, as a reference signal Vref, the voltage across the constant current source 2b. That is, the reference signal output circuit is composed of the reference pixels 12b, the power source 6b, and the constant current sources 2b. Output of reference signal by the reference pixel 12b allows the response characteristic of the pixels 1a and 1b to the device temperature to be simulated accurately, so that a temperature drift correction of high precision can be realized. In particular, as in this embodiment, the reference pixel 12b is made by excluding the thermally insulating structure and/or infrared ray absorbing structure from the pixels in a part of the pixel area. With this arrangement, deviation in characteristic due to slight difference in the manufacturing condition can be prevented, and the temperature response characteristic of the pixels 1a and 1b can be simulated more precisely. In this case, in order that the signal of reference pixel may not appear in the captured image, the reference pixel is preferably located at one row or column of the pixel area in horizontal or vertical direction. Still more, in the reference signal output circuit, a thermistor may be used instead of the reference pixel.

(5) Sample Hold Circuit

Figure 4:
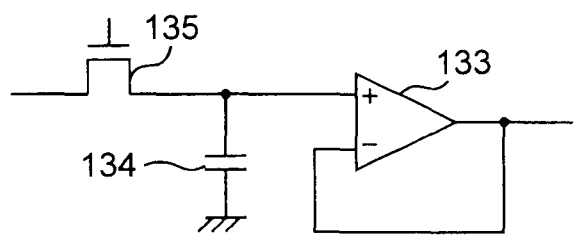
FIG. 4 is a circuit diagram showing an example of a sample hold circuit used in the embodiment of the present invention.

The configuration of the sample hold circuits 13, . . . in this embodiment and in the following embodiments is arbitrary and is not particularly specified. For example, the same one as the sample hold circuit 128 shown in FIG. 2 may be used. Other structural example of the sample hold circuit 13 is shown in FIG. 4. FIG. 4 shows a known structure using an operational amplifier 133, in which a sample hold switch 135 is connected to a sample hold capacitor 134. A clock is supplied to the gate of the sample hold switch 135 at an output timing of the reference pixel 12b to open the switch.

Figure 5:
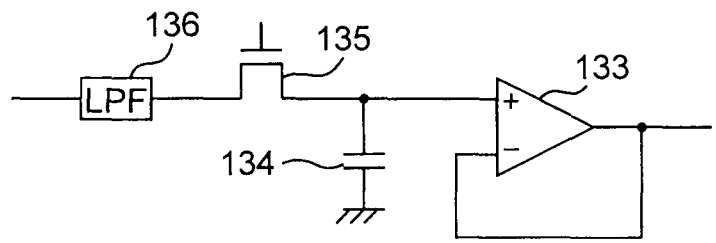
FIG. 5 is a circuit diagram showing other example of a sample hold circuit used in the embodiment of the present invention.

FIG. 5 shows an example of circuit configuration in the case of sample holding by averaging the output of a plurality of reference pixels 12b. In the front stage of the circuit shown in FIG. 4, the low pass filter 136 having a configuration as shown in FIG. 3A or FIG. 3B is inserted. Since the reference pixels to be averaged are output continuously in time, the time constant of the filter may be set to suppress change in the output of the filter temporally.

In this embodiment, the sample hold circuit 13, the bias generating circuit 14, the low pass filters 16 and 18, and the buffer amplifier 17 may be provided on a same chip as a chip on which the pixels 1a and 1b are foamed, or they may be provided outside the chip. The function of the buffer amplifier 18 may be included in the bias generating circuit 14. As far as the change of the output of the buffer amplifier 11 with respect to the reference pixels 12b can be suppressed, the relation of connection of the plus and minus input of the differential integrating circuits 7a and 7b, and the bias generating circuit 14 is not limited to this example. For example, in FIG. 1, the plus and minus input directions may be inverted entirely. Alternatively, an inverting amplifier may be included in the buffer amplifier 17 by inverting in part.

Second Embodiment

Figure 7:
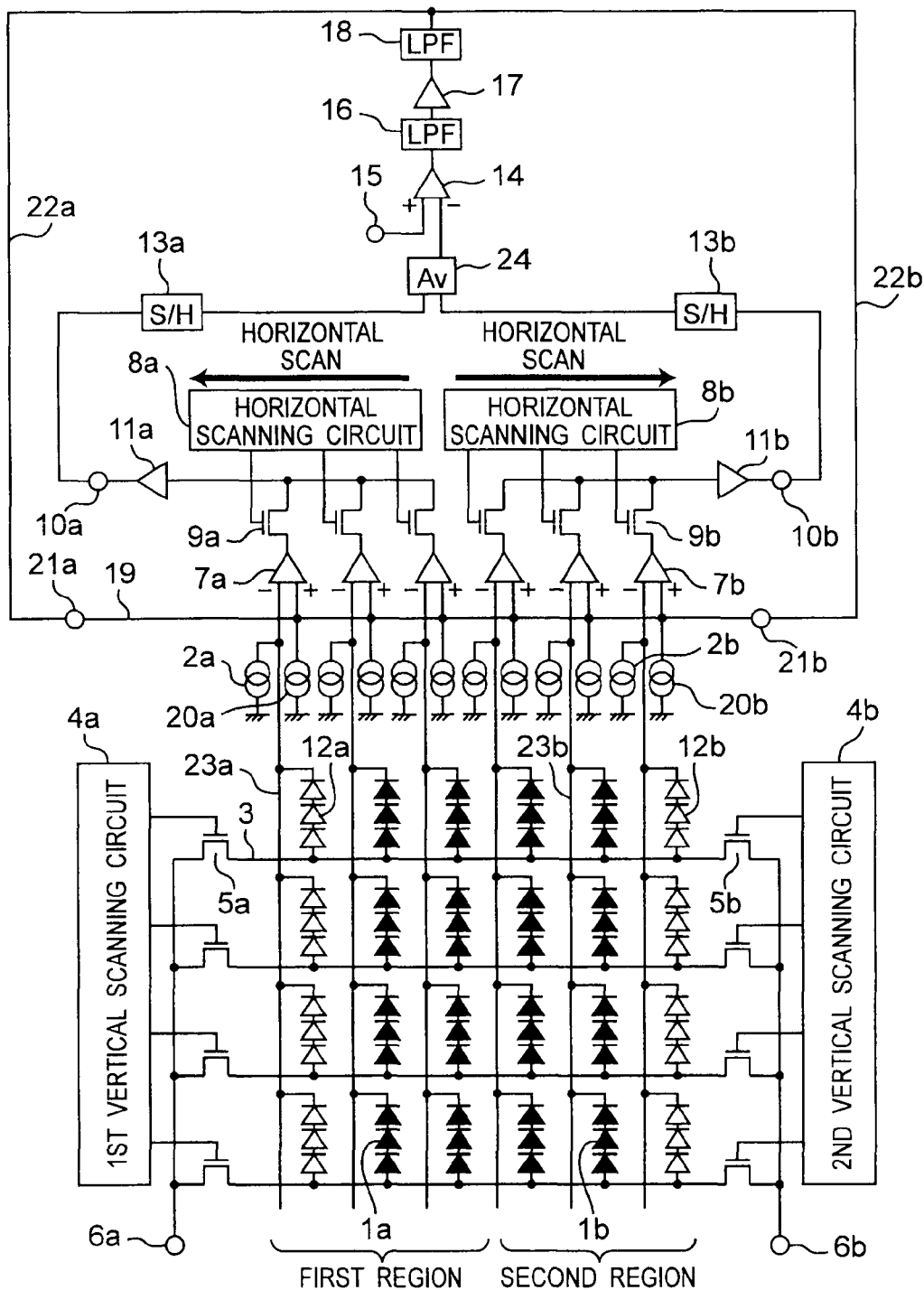
FIG. 7 is a circuit block diagram sowing a thermal infrared solid-state imaging device in a second embodiment of the present invention.

FIG. 7 is a circuit diagram of a thermal infrared solid-state imaging device in a second embodiment of the present invention. As shown in FIG. 7, the thermal infrared solid-state imaging device of the second embodiment is similar to that of the first embodiment in configuration, but it is different in the following structural points. The configuration and operation different from the thermal infrared solid-state imaging device of the first embodiment are specifically described below.

As shown in FIG. 7, the thermal infrared solid-state imaging device of the present embodiment is further provided with an analog averaging circuit 24 in addition to the configuration of the thermal infrared solid-state imaging device of the first embodiment. Moreover, in this embodiment, sample hold circuits 13a and 13b are provided to the signals from the first region and the second region of the pixel area, respectively. The input of the sample hold circuit 13a for the first region is connected to an output terminal 10a, and its output is connected to one input of the analog averaging circuit 24. The input of the sample hold circuit 13b for the second region is connected to an output terminal 10b, and its output is connected to the other input of the analog averaging circuit 24. The output of the analog averaging circuit 24 is connected to a minus input of the bias generating circuit 14.

In the thermal infrared solid-state imaging device of the embodiment having such configuration, the voltage across the constant current sources 2a and 2b connected to the reference pixels 12a and 12b provided in a column at an end of the pixel area is read out as a reference signal. The reference signal is read out in the same manner as signals of the normal pixels 1a and 1b. In other words, the voltage across the constant current sources 2a and 2b connected to the reference pixels 12a and 12b, and the voltage across the constant current sources 20a and 20b disposed adjacent to the constant current sources 2a and 2b and connected to the bias line 19 are respectively supplied to the minus input and the plus input of the differential integrating circuits 7a and 7b, and integrated and amplified. By the horizontal scanning circuits 8a and 8b and the switches 9a and 9b, the output signals corresponding to the reference pixels 12a and 12b are read in each line in ordinary reading of images, and are output from output terminals 10a and 10b by way of amplifiers 11a and 11b.

The signals from the output terminals 10a and 10b are fed respectively into the sample hold circuits 13a and 13b. The sample hold circuits 13a and 13b receive sample hold timing signals so as to perform sample hold operation at the timing of outputting of the signals of the reference pixel column to the output terminals 10a and 10b. The outputs of the sample hold circuits 13a and 13b are averaged by the analog averaging circuit 24, and then fed into the minus terminal of the bias generating circuit (basically a subtracting circuit) 14, to generate a bias voltage depending on the difference thereof. The generated bias voltage passes through the low pass filter 16, the buffer amplifier 17, and the low pass filter 18, and is branched, and supplied respectively into both ends 21a and 21b of the pixel area of the bias line 19 by way of wirings 22a and 22b. Herein, the wiring 22a and the wiring 22b are equalized in wiring resistance as far as possible.

Same as in the first embodiment, polarity for subtraction of the differential integrating circuits 7a and 7b and polarity for subtraction of the bias generating circuit 14 are selected in a direction to suppress the changes of the output signals corresponding to the reference pixels 12b. With this arrangement, depending on the difference between the sample-hold signal and the reference signal, the bias generating circuit 14 changes the voltage of the bias line 19 in a direction to reduce the difference.

In the present embodiment, therefore, same as in JP 2005-214639 A, voltage fluctuations of the bias line due to manufacturing fluctuations can be corrected automatically, and the device output corresponding to the reference pixels 12a and 12b (equivalent to the reference voltage level of the image signal) is nearly constant, not affected by manufacturing fluctuations of the direct-current offset components in the circuit, so that it is possible to prevent dynamic range-over in the subsequent-stage circuits inside and outside the device due to manufacturing fluctuations of each device. Moreover, the voltage of the bias line 19 not only simulates the voltage drop of the drive line by the current sources 2a and 2b provided in each column, but also changes while reflecting the device temperature drift information due to the reference pixels 12a and 12b. It is hence possible to realize suppression of offset distribution and temperature drift caused by voltage drop in the drive line 3.

As described hereinbefore, in this embodiment, the pixel area is divided into the first region and the second region, and two horizontal scanning circuits 8a and 8b, and two horizontal selecting switches 9a and 9b which are respectively responsible for reading out are provided, respectively. The two horizontal scanning circuits 8a and 8b simultaneously scan horizontally, and read out in parallel from the divided regions. As a result, the operation speed of the horizontal scanning circuit can be reduced to ½ compared with the conventional imaging device not intended to divide and read out in parallel.

Moreover, by executing the scanning of the horizontal scanning circuits 8a and 8b from the center toward the end of the pixel area, the output of the reference pixel formed only in the end portion of the pixel area can be obtained also in the final period of horizontal scanning. Therefore, during the blanking (fly-back) period, the output from the reference pixel is maintained at the output terminal (see FIG. 9). Accordingly, during the blanking period, the output from the reference pixel can be extracted by the sample hold circuit 13. Hence, the extraction precision of the output level from the reference pixel can be enhanced.

Further, as mentioned above, by the use of the differential integrating circuits 7a and 7b and the bias line 19, effects of the voltage drop of the drive line 3 on the output may be suppressed, but slight effects may remain. In such a case, the output level may differ between the reference pixel 12a formed at the left end of the pixel area and the reference pixel 12b formed at the right end of the pixel area. To solve this problem, in this embodiment, the output level of the reference pixels 12a and 12b extracted by the sample hold circuits 13a and 13b are averaged by the analog averaging circuit 24 to be used in feedback. As a result, feedback of reference signal substantially corresponding to temperature fluctuations of the entire pixel area is realized, and the temperature drift due to device temperature fluctuations can be suppressed at high precision.

The drive line 3 is driven by two-end driving by the two vertical scanning circuits 4a and 4b disposed at both ends of the pixel area, and the bias line 19 is also driven at both ends of the pixel area. As a result, increase of voltage drop of the drive line 3 caused by mega-pixel structure can be extremely decreased, and is controlled within the input voltage range of the differential integrating circuits 7a and 7b. By the differential integrating circuits 7a and 7b thus made usable, voltage drop of the drive line 3 and voltage drop of the bias line 19 are canceled each other, sc that the offset voltage at the output voltage can be extremely decreased.

Therefore, according to the present embodiment, even when the number of pixels in the two-dimensional pixel array of the thermal infrared solid-state imaging device is increased, an excellent thermal infrared solid-state imaging device can be presented, which can solve problems of decrease of operating speed of the horizontal scanning circuits 8a and 8b and voltage drop in the drive line at the same time and suppress temperature drift due to device temperature fluctuations precisely.

Third Embodiment

Figure 8:
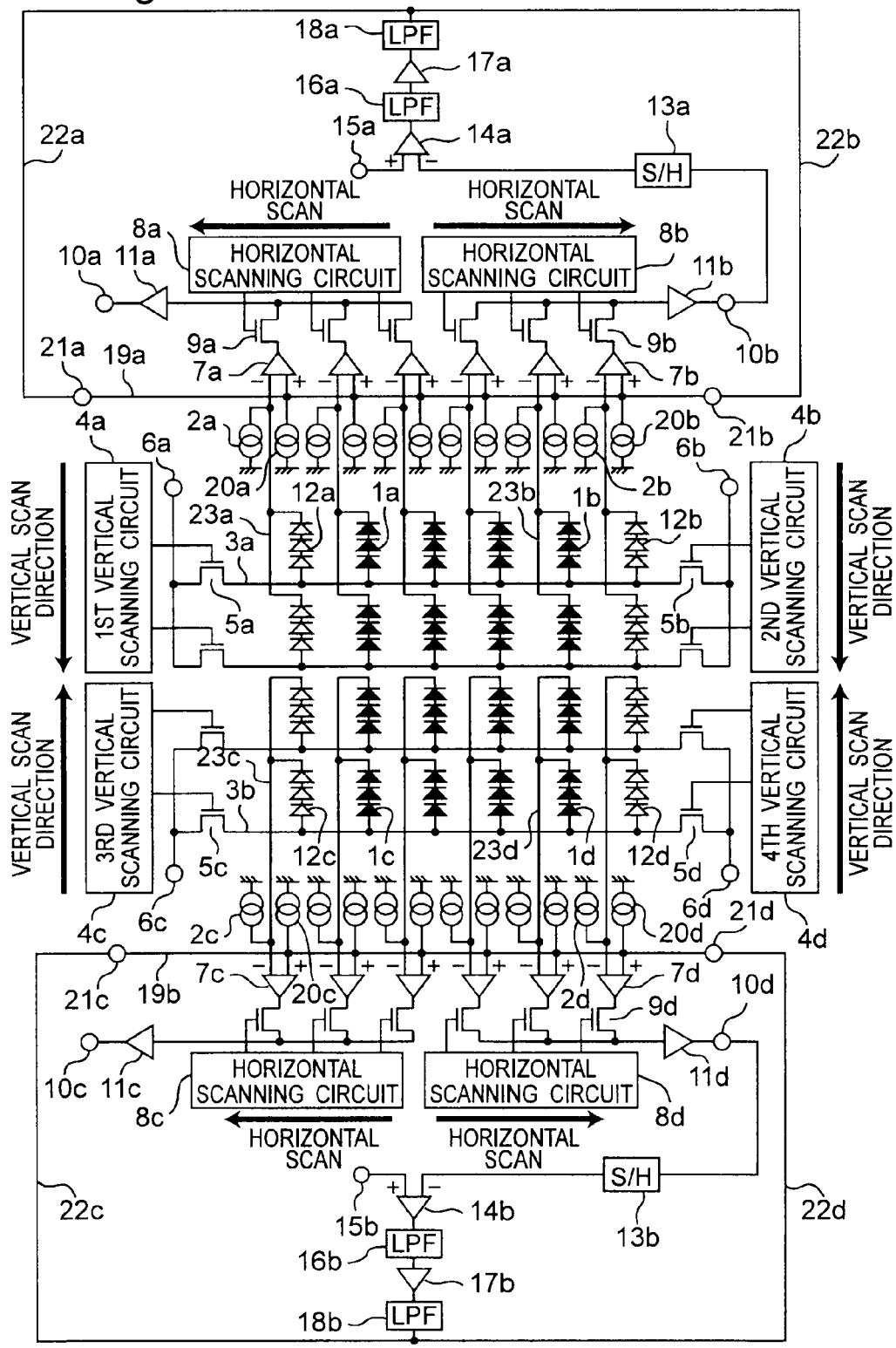
FIG. 8 is a circuit block diagram sowing a thermal infrared solid-state imaging device in a third embodiment of the present invention.

FIG. 8 is a circuit diagram of a thermal infrared solid-state imaging device in a third embodiment of the present invention. In the thermal infrared solid-state imaging device, same as in the first embodiment, a plurality of diodes having an infrared ray absorbing structure and a thermally insulating structure are connected in series to compose the respective photosensitive pixels 1a, 1b, 1c, and 1d. The photosensitive pixels 1a, 1b, 1c, and 1d are combined to compose a two-dimensionally arrayed pixel area.

The pixel area is divided into four regions, upper and lower, right and left, from the center, that is, first to four regions. Preferably, the number of pixels included in each region should be identical. The photosensitive pixel 1a is a photosensitive pixel formed in the first region which is the upper left region of the pixel area. The photosensitive pixel 1b is a photosensitive pixel formed in the second region which is the upper right region of the pixel area. The photosensitive pixel 1c is a photosensitive pixel formed in the third region which is the lower left region of the pixel area. The photosensitive pixel 1d is a photosensitive pixel formed in the fourth region which is the lower right region of the pixel area.

In each row of the photosensitive pixels 1a and 1b, a drive line 3a commonly connecting the photosensitive pixels 1a and 1b is provided. In each row of the photosensitive pixels 1c and 1d, a drive line 3b commonly connecting the photosensitive pixels 1c and 1d is provided. In each of columns of the photosensitive pixels 1a and 1b, signal lines 23a and 23b (first signal lines) commonly connecting the photosensitive pixels 1a and 1b respectively are provided. Constant current sources 2a and 2b are connected to the ends of the signal lines 23a and 23b respectively, as the first constant current means group. In each of columns of the photosensitive pixels 1c and 1d, signal lines 23c and 23d (second signal lines) commonly connecting the photosensitive pixels 1c and 1d respectively are provided. Constant current sources 2c and 2d are connected to the ends of the signal lines 23c and 23d respectively, as the first constant current means group. The signal line 23a and the signal line 23c are separated, not connected electrically, at the boundary of the first region and the third region of the pixel area. The signal line 23b and the signal line 23d are separated, not conducted electrically, at the boundary of the second region and the fourth region of the pixel area.

At the upper left pixel area, the first vertical scanning circuit 4a and the first switch 5a are formed. At the upper right pixel area, the second vertical scanning circuit 4b and the second switch 5b are formed. At the lower left pixel area, the third vertical scanning circuit 4c and the third switch 5c are formed. At the lower right pixel area, the fourth vertical scanning circuit 4d and the fourth switch 5d are formed. In this manner, according to this embodiment, the vertical scanning circuit is composed of the vertical scanning circuits 4a and 4c provided at the left part of the pixel area (the first and third regions) and the vertical scanning circuits 4b and 4d provided at the right part of the pixel area (the second and fourth regions).

The drive lines 3a are sequentially selected by the first vertical scanning circuit 4a and the first switches 5a, and the selected drive line 3a is connected to the power source 6a. At the same time, the drive lines 3a are sequentially selected by the second vertical scanning circuit 4b and the second switches 5b, and the selected drive line 3a is connected to the power source 6b. The power source 6a and the power source 6b are power sources providing same voltage. By this configuration, each selected drive line 3a is provided with a voltage from the both ends of the wiring 3a (two-end driving) by the two power sources 6a and 6b with the same voltage. Similarly, the drive lines 3b are sequentially selected by the third vertical scanning circuit 4c and the third switch 5c, and each drive line 3b is connected to the power source 6c. At the same time, the drive lines 3b are sequentially selected by the fourth vertical scanning circuit 4d and the fourth switches 5d, and each drive line 3b is connected to the power source 6d. The power source 6c and the power source 6d are power sources providing same voltage. That is, each selected drive line 3b is provided with a voltage from the both ends of the drive line 3b (two-end driving) from the two power sources 6c and 6d with the same voltage.

On the other hand, adjacently to the constant current sources 2a and 2b, in each of columns of the pixels 1a and 1b, constant current sources 20a and 20b passing a current nearly same as the constant current sources 2a and 2b are disposed, as the second constant current means group. The constant current sources 20a and 20b are connected in parallel by means of the bias line 19a (the first bias line) which is nearly parallel to the drive lines 3a. Further, adjacently to the constant current sources 2c and 2d, in each of columns of the pixels 1c and 1d, constant current sources 20c and 20d passing a current nearly same as the constant current sources 2c and 2d are disposed, as the second constant current means group. The constant current sources 20c and 20d are connected in parallel by means of the bias line 19b (second bias line) which is nearly parallel to the drive lines 3b. The bias lines 19a and 19b have a resistance value nearly same as that of the drive lines 3a and 3b so as to cause a voltage drop nearly same as that of the drive lines 3a and 3b. The bias lines 19a and 19b are not always required to have a resistance same as that of the drive lines 3a and 3b, as far as a voltage drop nearly same as that of the drive lines 3a and 3b occurs. If the current values of the constant current sources 2a, 2b, 2c and 2d are different from those of the constant current sources 20a, 20b, 20c and 20d, the bias lines 19a and 19b and the drive lines 3a and 3b may have different resistance values accordingly.

In each of columns of the pixels 1a and 1b, differential amplifying and integrating circuits 7a and 7b (first differential integrating circuits) are formed. The differential amplifying and integrating circuits 7a and 7b integrate, amplify, and produce the difference between the voltage across the constant current sources 2a and 2b and the voltage across the constant current sources 20a and 20b. In each of columns of the pixels 1c and 1d, differential amplifying and integrating circuits 7c and 7d (second differential integrating circuits) are formed. The differential amplifying and integrating circuits 7c and 7d integrate, amplify, and produce the difference between the voltage across the constant current sources 2c and 2d, and the voltage across the constant current sources 20c and 20d.

For the photosensitive pixels 1a in the first region, a horizontal scanning circuit 8a and a horizontal selecting switches 9a are formed. For the photosensitive pixels 1b in the second region, a horizontal scanning circuit 8b and horizontal selecting switches 9b are formed. The horizontal scanning circuits 8a and 8b simultaneously scan horizontally from the boundary of the first region and the second region of the pixel area toward the end portion of the pixel area, respectively. The horizontal scanning circuits 8a and 8b turn on the horizontal selecting switches 9a and 9b sequentially, so that the output signal of the differential integrating circuit 7a and 7b disposed in each column is output to the outside from output terminals 10a and 10b by way of output amplifiers 11a and 11b.

On the bias line 19a, a voltage drop nearly same as in the drive line 3a occurs. Accordingly, with this configuration, the voltage drop component at the drive line 3a is canceled from the output signal, so that the offset distribution by the drive line 3a is eliminated. In other words, the difference between the reference signal and the voltage of the bias line 19a is obtained, the differential signal is compared with a specified reference voltage, and then a bias voltage depending on the difference is generated and is fed back to the bias line 19a. As a result, while changing the voltage of the bias line 19a depending on the reference signal (depending on the device temperature), voltage fluctuations of the bias line due to manufacturing fluctuations can be corrected automatically.

For the photosensitive pixels 1c in the third region, a horizontal scanning circuit 8c and a horizontal selecting switches 9c are formed. For the photosensitive pixels 1d in the fourth region, a horizontal scanning circuit 8d and a horizontal selecting switches 9d are formed. The horizontal scanning circuits 8c and 8d simultaneously scan horizontally from the boundary of the third region and the fourth region of the pixel area toward the end portion of the pixel area, respectively. The horizontal scanning circuits 8c and 8d turn on the horizontal selecting switches 9c and 9d sequentially, so that the output signal of the differential integrating circuit 7c and 7d disposed in each column is output to the outside from output terminals 10c and 10d by way of output amplifiers 11c and 11d. In this manner, according to the embodiment, the horizontal scanning circuit is composed of two horizontal scanning circuits 8a and 8b provided at the upper part of the pixel area (the first and second regions), and two horizontal scanning circuits 8c and 8d provided at the lower part of the pixel area (the third and fourth regions).

In the bias line 19b, a voltage drop nearly same as in the drive line 3b occurs. Accordingly, by this configuration, the voltage drop component at the drive line 3b is canceled from the output signal, so that the offset distribution attributable to the drive line 3b is eliminated. In other words, the difference between the reference signal and the voltage of the bias line 19b is obtained, and the differential signal is compared with a specified reference voltage, and a bias voltage depending on the difference is generated, and is fed back to the bias line 19b. As a result, while changing the voltage of the bias line 19b depending on the reference signal (depending on the device temperature), voltage fluctuations of the bias line due to manufacturing fluctuations can be corrected automatically.

In this embodiment, the pixels in one column at the upper right part of the pixel area are used for reference pixels 12b, and the voltage across the constant current source 2b connected to the reference pixels 12b is read out as a reference signal. This reference signal is read out in a same manner as the signal of the normal pixel 1b. That is, the voltage across the current source 2b connected to the reference pixel 12b and the voltage across the current source 20b disposed adjacent to the constant current source 2b and connected to the bias line 19a are respectively fed to the minus and plus input of the differential integrating circuit 7b, and integrated and amplified. By the horizontal scanning circuit 8b and the switch 9b, the output signal corresponding to the reference pixel 12b is read out in each line in normal image reading, and is output from the output terminal 10b by way of the amplifier 11b. In the meantime, the pixels at the upper left column of the pixel area are provided as reference pixels 12a, but this is to unify the number of pixels preferably between the first region and the second region. In this embodiment, they are not used for the purpose of feedback of reference signal. Of course, instead of the reference pixels 12b, the reference pixels 12a may be used for the purpose of feedback of reference signal.

Moreover, the pixels at the lower right column of the pixel area are provided as reference pixels 12d, and the voltage across the constant current source 2d connected to the reference pixel 12d is read out as a reference signal. This reference signal is read out in a same way as the signal of the normal pixel 1d. That is, the voltage across the current source 2d connected to the reference pixel 12d and the voltage across the current source 20d which is adjacent to the current source 2d and connected to the bias line 19b are respectively fed to the minus and plus input of the differential integrating circuit 7d, and integrated and amplified. By the horizontal scanning circuit 8d and the switch 9d, the output signal corresponding to the reference pixel 12d is read out in each line in normal image reading, and output from the output terminal 10d by way of the amplifier 11d. In the meantime, the pixels at the lower left column of the pixel area are provided as reference pixels 12c, but this is to unify the number of pixels preferably between the third region and the fourth region. In this embodiment, they are not used for the purpose of feedback of reference signal. Of course, instead of the reference pixels 12d, the reference pixels 12c may be used for the purpose of feedback of reference signal.

The output terminal 10b is connected to a sample hold circuit 13a, to which a sample hold timing signal is supplied so that sample hold operation may be carried out at the timing when the signal of the reference pixel column is output to the output terminal 10b. The output of the sample hold circuit 13a is fed to the minus terminal of the bias generating circuit (basically the subtraction circuit) 14a. A reference voltage is fed to the plus terminal of the bias generating circuit 14a. The bias generating circuit 14a (the first bias generating circuit) generates a bias voltage depending on the difference between the voltages supplied in the both input terminals. The generated bias voltage passes through a low pass filter 16a, a buffer amplifier 17a, and a low pass filter 18a, and is entered into both ends 21a and 21b of the pixel area of the bias line 19a by way of wirings 22a and 22b. Herein, the wiring resistance values of the wiring 22a and the wiring 22b are equalized as far as possible.

The output terminal 10d is connected to a sample hold circuit 13b, to which a sample hold timing signal is supplied so that sample hold operation may be carried out at the timing when the signal of the reference pixel column is output to the output terminal 10d. The output of the sample hold circuit 13b is fed to the minus terminal of the bias generating circuit (basically the subtraction circuit) 14b. The bias generating circuit 14b (the second bias generating circuit) generates a bias voltage depending on the difference between the voltages supplied in the both input terminals. The generated bias voltage passes through a low pass filter 16b, a buffer amplifier 17b, and a low pass filter 18b, and is branched, and entered respectively into both ends 21c and 21d of the pixel area of the bias line 19b by way of wirings 22c and 22d. Herein, the wiring resistance of the wiring 22c and the wiring 22d are equalized as far as possible.

Polarity for subtraction of the differential integrating circuits 7a and 7b and polarity for subtraction of the bias generating circuit 14a are selected in a direction of suppressing the changes of the output signals corresponding to the reference pixels 12b. That is, when the voltage of the bias line 19a (the voltage of current sources 20a and 20b connected to the bias line 19a) is fed to the plus input of the differential integrating circuits 7a and 7b, the outputs of the differential integrating circuits 7a and 7b are fed to the minus input of the bias generating circuit 14a. To the contrary, when the voltage of the bias line 19a is fed to the minus input of the differential integrating circuits 7a and 7b, the outputs of the differential integrating circuits 7a and 7b are fed to the plus input of the bias generating circuit 14a. As a result, depending on the difference of the sample-hold signal and the reference signal, the bias generating circuit 14a changes the voltage of the bias line 19a in a direction of decreasing the difference. This is true for the corresponding circuit in the lower part of the pixel area.

With this configuration, also in this embodiment, same as in JP2005-214639A, voltage fluctuations of the bias line due to manufacturing fluctuations can be corrected automatically, and the device output corresponding to the reference pixels 12b and 12d (equivalent to the reference voltage level of the image signal) is nearly constant, not having effects of manufacturing fluctuations of the direct-current offset components in the circuit, so that it is possible to prevent dynamic range-over due to manufacturing fluctuations of each device in the subsequent-stage circuits inside and outside the device. Moreover, the voltage of the bias lines 19a and 19b not only simulates the voltage drop of the drive lines 3a and 3b caused by the current sources 2a and 2b provided in each column, but also changes while reflecting the device temperature drift information due to the reference pixels 12b and 12d. It is hence possible to suppress offset distribution and temperature drift caused by voltage drop in the drive lines 3a and 3b.

As described herein, in this embodiment, the pixel area is divided into first, second, third, and fourth regions, and four horizontal scanning circuits 8a, 8b, 8c and 8d, and four horizontal selecting switches 9a, 9b, 9c and 9d respectively responsible for reading out are provided, and the four horizontal scanning circuits 8a, 8b, 8c and 8d which simultaneously scan horizontally and read out four regions in parallel. As a result, as compared with the conventional imaging device which does not read in parallel from divided regions, the operation speed of the horizontal scanning circuit can be reduced to ¼. Herein, the signal lines 23a and 23b in which a pixel diode current flows when reading out the upper pixel area (the first and second regions), and the signal lines 23c and 23d in which a pixel diode current flows when reading out the lower pixel area (the third and fourth regions) are separated at the boundary of the first and third regions and at the boundary of the second and fourth regions, not connected electrically. Accordingly, reading (integrating operation of diode current) of the upper pixel area (the first and second regions), and reading (integrating operation of diode current) of the lower pixel area (the third and fourth regions) can be driven simultaneously in parallel.

Moreover, by executing the scanning of the horizontal scanning circuits 8a, 8b, 8c, and 8d from the center toward the end of the pixel area, the output of the reference pixels 12b and 12d, which can be formed only in the end of the pixel area, can be obtained also in the final period of horizontal scanning. As a result, during the blanking (fly-back) period, the output from the reference pixels 12b and 12d maintained at the output terminal 10b and 10d may be only extracted by the sample hold circuits 13a and 13b, and the extraction precision of the output level from the reference pixel can be enhanced. By feeding back the output of the reference pixel extracted at high precision, the temperature drift due to device temperature fluctuations can be suppressed effectively.

At both the upper pixel area (the first and second regions) and the lower pixel area (the third and fourth regions), the drive lines 3a and 3b are driven in two-end driving by the two vertical scanning circuits 4a and 4b, and 4c and 4d disposed at both ends of the pixel area. The bias lines 19a and 19b are also driven at both ends of the pixel area in two-end driving. As a result, increase of voltage drop of the drive lines 3a and 3b by mega-pixel structure can be extremely decreased, and is controlled within the input voltage range of the differential integrating circuits 7a and 7b, 7c, and 7d. By the differential integrating circuits 7a, 7b, 7c, and 7d thus made usable, voltage drop of the drive lines 3a and 3b and voltage drop of the bias line are canceled each other, so that the offset voltage at the output voltage can be extremely decreased.

Therefore, according to the embodiment, even though the number of pixels in the two-dimensional pixel array of the thermal infrared solid-state imaging device is increased, an excellent thermal infrared solid-state imaging device can be presented, which can solve problems of decrease of operating speed of the horizontal scanning circuits and voltage drop in the drive line at the same time and suppress precisely temperature drift due to device temperature fluctuations.

Fourth Embodiment

Figure 14:
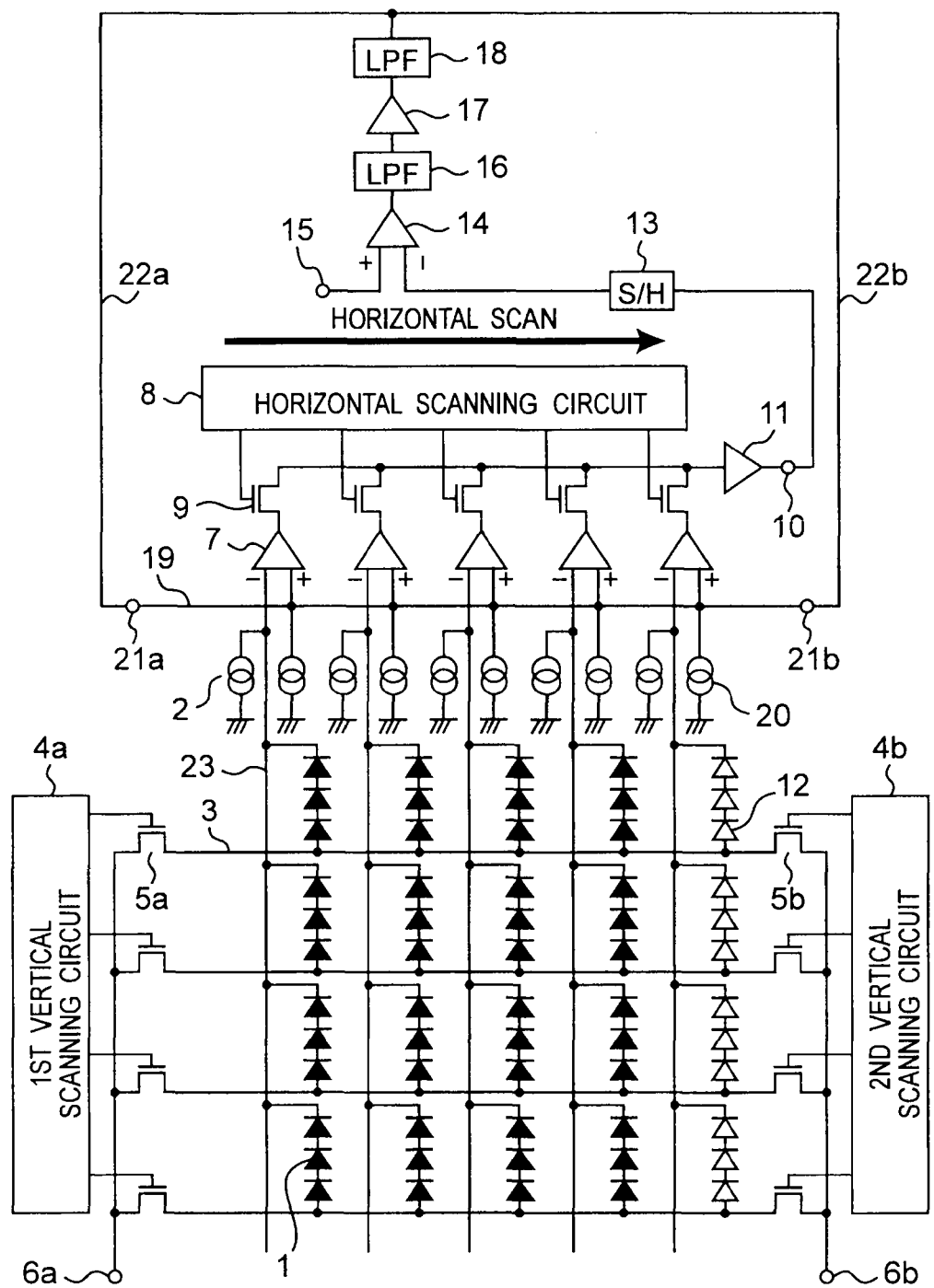
FIG. 14 is a circuit block diagram sowing a thermal infrared solid-state imaging device in a fourth embodiment of the present invention.

FIG. 14 is a circuit diagram of a thermal infrared solid-state imaging device in a fourth embodiment of the present invention. As shown in FIG. 14, the thermal infrared solid-state imaging device of the fourth embodiment has a configuration nearly same as that of the thermal infrared solid-state imaging device in the first embodiment, but the configuration is partly different. The configuration and operation different from the thermal infrared solid-state imaging device in the first embodiment are specifically described below.

The thermal infrared solid-state imaging device in the first embodiment has two horizontal scanning circuits 8a and 8b. By contrast, thermal infrared solid-state imaging device in the fourth embodiment has, as shown in FIG. 14, only one horizontal scanning circuit 8, unlike the configuration of the thermal infrared solid-state imaging device in the first embodiment. The horizontal scanning circuit 8 selects the output signal of a differential integrating circuit 7 corresponding to the pixel of the pixel area in each column, and leads the signal to an output terminal 10.

In the thermal infrared solid-state imaging device of this embodiment having the above configuration, the voltage across a constant current source 2 connected to a reference pixel 12 provided in the column at the end of the pixel area is read out as a reference signal. This reference signal is read out in the same manner as the signal of a normal pixel 1. That is, the voltage across the current source 2 connected to the reference pixel 12 and the voltage across a current source 20 which is adjacent to the current source 2 and is connected to a bias line 19 are fed respectively to the minus and plus inputs of the differential integrating circuit 7, and integrated and amplified. By a horizontal scanning circuit 8 and a switch 9, an output signal corresponding to the reference pixel 12 is read out in each line in normal image reading, and is output from the output terminal 10 by way of an amplifier 11.

The signal from the output terminal 10 is supplied to a sample hold circuit 13. The sample hold circuit 13 is supplied with a sample hold timing signal to perform sample hold operation at the timing when the signal of the reference pixel column is output to the output terminal 10. The output of the sample hold circuit 13 is fed to the minus terminal of a bias generating circuit (basically a subtraction circuit) 14. A reference signal is fed to the plus terminal of the bias generating circuit 14. Hence, the bias generating circuit 14 generates a bias voltage depending on the difference between the sample-hold signal and the reference signal. The generated bias voltage passes through a low pass filter 16, a buffer amplifier 17, and a low pass filter 18, and is then branched. The branched bias voltage passes through wirings 22a and 22b, and is supplied to both ends 21a and 21b of the pixel area of the bias line 19. The wiring resistance values of the wirings 22a and 22b are equalized as far as possible.

Same as in the first embodiment, polarity for subtraction of the differential integrating circuit 7 and polarity for subtraction of the bias generating circuit 14 are selected in a direction of suppressing the changes of the output signals corresponding to the reference pixel 12. Accordingly, depending on the difference between the sample-hold signal and the reference signal, the bias generating circuit 14 changes the voltage of the bias line 19 in a direction of decreasing the difference.

In this embodiment, therefore, same as in JP2005-214639A, voltage fluctuations of the bias line due to manufacturing fluctuations can be corrected automatically. Hence, the device output corresponding to the reference pixel 12 (equivalent to the reference voltage level of the image signal) is nearly constant, not having effects of manufacturing fluctuations of the direct-current offset components in the circuit, so that it is possible to prevent dynamic range-over phenomenon in the later-stage circuits inside and outside the device due to manufacturing fluctuations of each device. Moreover, the voltage of the bias line 19 not only simulates the voltage drop of the drive line caused by the current sources 2 and 20 provided in each column, but also changes while reflecting the device temperature drift information due to the reference pixel 12. It is hence possible to suppress offset distribution and temperature drift caused by voltage drop in the drive line 3a.

As described herein, in this embodiment, the drive line 3 is driven in two ends driving by the two vertical scanning circuits 4a and 4b disposed at both ends of the pixel area. The bias line 19a is also driven at two ends of the pixel area in two ends driving. Accordingly, increase of voltage drop of the drive line 3 by mega-pixel structure can be extremely decreased, and is controlled within the input voltage range of the differential integrating circuit 7. By the differential integrating circuit 7 thus made usable, voltage drop of the drive line 3 and voltage drop of the bias line 19a are canceled each other, so that the offset voltage at the output voltage can be extremely decreased.

Therefore, according to the embodiment, even though the number of pixels is increased in the two-dimensional pixel array of the thermal infrared solid-state imaging device, a thermal infrared solid-state imaging device can be presented which is capable of solving problems of voltage drop in the drive line and suppressing precisely the temperature drift due to device temperature fluctuations.

What is claimed is:

1. A thermal infrared solid-state imaging device including a pixel area having photosensitive pixels disposed two-dimensionally, the photosensitive pixel having first and second terminals and including one or more diodes connected in series, the diode including a thermally insulating structure and/or an infrared ray absorbing structure, the thermal infrared solid-state imaging device comprising:

drive lines each connecting commonly the first terminals of the photosensitive pixels in each row of the pixel area;

first and second vertical scanning circuits for selecting the drive line sequentially, and supplying a supply voltage to the selected drive line at both ends of the pixel area, respectively;

signal lines connecting commonly second terminals of the photosensitive pixels in each column of the pixel area, the signal line being connected to first constant current means at end of the signal line;

a bias line connecting in parallel second constant current means provided in each column of the pixel area, and generating a voltage drop substantially same as that of the drive line;

a differential integrating circuit that is provided in each column of the pixel area, for integrating a difference between a voltage across the first constant current means and a voltage across the second constant current means for a predetermined period of time, and outputting the integration result;

a horizontal scanning circuit for selecting in each column an output signal of the differential integrating circuit with respect to the pixel of the pixel area and leading the output signal to an output terminal;

a reference signal output circuit for outputting a reference signal which changes substantially depending on the temperature change of the entire thermal infrared solid-state imaging device, the reference signal output circuit including one or plural of reference dummy pixel columns, the reference dummy pixel column including reference dummy pixels each of which does not include a thermally insulating structure and/or an infrared ray absorbing structure; and a bias generating circuit for generating a bias voltage depending on a difference between a differential signal between a voltage at a specified position on the bias line and the reference signal, and a reference voltage, wherein the bias voltage is applied to positions on the bias line corresponding to both ends of the pixel area.

2. The thermal infrared solid-state imaging device according to claim 1, wherein the horizontal scanning circuit comprises:

a first horizontal scanning circuit for selecting in each column an output signal of the differential integrating circuit corresponding to a first pixel group in the pixel area, and leading the selected output signal to the output terminal; and a second horizontal scanning circuit for selecting in each column an output signal of the differential integrating circuit corresponding to a second pixel group in the pixel area, and leading the selected output signal to the output terminal.

3. The thermal infrared solid-state imaging device according to claim 2, wherein the pixel area is divided into a first region including the first pixel group and a second region including the second pixel group, the first horizontal scanning circuit selects the output signal of the differential scanning circuit corresponding to the first region of the pixel area in each column and leads the selected output signal to the output terminal, while scanning from the boundary of the first region and the second region of the pixel area, toward the end of the first region of the pixel area, and the second horizontal scanning circuit selects the output signal of the differential scanning circuit corresponding to the second region of the pixel area in each column and leads the selected output signal to the output terminal, while scanning from the boundary of the first region and the second region of the pixel area, toward the end of the second region of the pixel area.

4. The thermal infrared solid-state imaging device according to claim 3, wherein the reference dummy pixel column is provided in a column at the end of the pixel area.

5. The thermal infrared solid-state imaging device according to claim 2, wherein the reference dummy pixel column is provided in a column at the end of the pixel area.

6. The thermal infrared solid-state imaging device according to claim 1, wherein the horizontal scanning circuit comprises:

a first horizontal scanning circuit selects the output signal of the differential scanning circuit corresponding to the first region of the pixel area in each column and leads the selected output signal to the output terminal, while scanning from the boundary of the first region and the second region of the pixel area, toward the end of the first region of the pixel area, and a second horizontal scanning circuit selects the output signal of the differential scanning circuit corresponding to the second region of the pixel area in each column and leads the selected output signal to the output terminal, while scanning from the boundary of the first region and the second region of the pixel area, toward the end of the second region of the pixel area, the one or plural of reference dummy pixel columns are formed in the first region and the second region, an averaging circuit is further provided in a front stage of the bias generating circuit, which generates an average signal of a first differential signal which is a difference between a voltage at a specified position on the bias line and the reference signal in the first region, and a second differential signal which is a difference between a voltage at a specified position on the bias line and the reference signal in the second region, and the bias generating circuit generates a bias voltage according to the difference between the signal from the averaging circuit and the reference voltage.

7. The thermal infrared solid-state imaging device according to claim 6, wherein the reference dummy pixel column is provided in a column at the end of the pixel area.

8. The thermal infrared solid-state imaging device according to claim 1, wherein the first vertical scanning circuit comprises
1'st vertical scanning circuit provided for a first region of the pixel area, and
3rd vertical scanning circuit provided for a second region of the pixel area, the second vertical scanning circuit comprises
2nd vertical scanning circuit provided for the first region of the pixel area, and
4th vertical scanning circuit provided for the second region of the pixel area, the signal line comprises
a first signal line which connects commonly the second terminals of the photosensitive pixels in the first region in each column, and is connected to a first constant current means at the end of the first signal line, and a second signal line which commonly connects the second terminals of the photosensitive pixels in the second region in each column, and is connected to the first constant current means at the end of the second signal line, the bias line comprises
- a first bias line provided in each column of the first region of the pixel area, and
- a second bias line provided in each column of the second region of the pixel area, the differential integrating circuit comprises
- a first differential integrating circuit provided in each column of the first region of the pixel area, and
- a second differential integrating circuit provided in each column of the second region of the pixel area, the horizontal scanning circuit comprises
- first and second horizontal scanning circuits for selecting the output signal of the first differential integrating circuit in each column and leading the selected output signal to the output terminal, while scanning from the center of the pixel area respectively to both ends of the pixel area, and
- third and fourth horizontal scanning circuits for selecting the output signal of the second differential integrating circuit in each column and leading the selected output signal to the output terminal, while scanning from the center of the pixel area respectively to both ends of the pixel area, the bias voltage generating circuit comprises
- a first bias generating circuit for generating a first bias voltage according to a difference between a differential signal between a voltage at a specified position on the first bias line and the reference signal, and a reference voltage, and
- a second bias generating circuit for generating a second bias voltage according to a difference between a differential signal between a voltage at a specified position on the second bias line and the reference signal, and a reference voltage, the first bias voltage is applied to positions corresponding to both ends of the pixel area on the first bias line; and the second bias voltage is applied to positions corresponding to both ends of the pixel area on the second bias line.

9. The thermal infrared solid-state imaging device according to claim 8, wherein the reference dummy pixel column is provided in a column at the end of the pixel area.

10. The thermal infrared solid-state imaging device according to claim 1, wherein the reference dummy pixel column is provided in a column at the end of the pixel area.

* * * * *